United States Patent
Elsäber et al.

(10) Patent No.: US 11,079,411 B2
(45) Date of Patent: Aug. 3, 2021

(54) ELECTROMECHANICAL COMPONENT, ELECTROMECHANICAL COMPONENT ARRANGEMENT, METHOD OF DETECTING A POTENTIAL DIFFERENCE BY USING AN ELECTROMECHANICAL COMPONENT, AND METHOD FOR PERFORMING A FUNCTIONAL TEST ON THE ELECTROMECHANICAL COMPONENT

(71) Applicant: Fraunhofer-Gesellschaft zur Förderung der angewandten Forschung e.V., Munich (DE)

(72) Inventors: Linus Elsäber, Dresden (DE); Matthias Schulze, Dresden (DE); Martin Friedrichs, Dresden (DE); Christoph Hohle, Moritzburg (DE); Detlef Kunze, Dresden (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 301 days.

(21) Appl. No.: 16/159,552

(22) Filed: Oct. 12, 2018

(65) Prior Publication Data
US 2019/0086446 A1 Mar. 21, 2019

Related U.S. Application Data

(63) Continuation of application No. PCT/EP2017/058669, filed on Apr. 11, 2017.

(30) Foreign Application Priority Data

Apr. 13, 2016 (DE) .......................... 102016206208.5

(51) Int. Cl.
G01R 35/00 (2006.01)
G01R 29/12 (2006.01)
G01R 15/16 (2006.01)

(52) U.S. Cl.
CPC ........... *G01R 15/165* (2013.01); *G01R 29/12* (2013.01); *G01R 35/00* (2013.01)

(58) Field of Classification Search
CPC .......... G01R 5/00; G01R 7/00; G01R 15/165; G01R 31/31702; G01R 35/00;
(Continued)

(56) References Cited

U.S. PATENT DOCUMENTS 5,617,020 A    4/1997  Campbell et al.
7,723,810 B2   5/2010  Miller et al.
(Continued)

FOREIGN PATENT DOCUMENTS

CN    1302259 A     7/2001
CN    101593657 A   12/2009
(Continued)

OTHER PUBLICATIONS

English translation of International Preliminary Examination Report issued in issued in application No. PCT/EP2017/058669 dated Jun. 27, 2018.
(Continued)

*Primary Examiner* — Son T Le
(74) *Attorney, Agent, or Firm* — McClure, Qualey & Rodack, LLP

(57) ABSTRACT

An electromechanical component and an electromechanical component arrangement for proving the existence of a potential difference which consists of a first electrode, a second electrode and a proving structure. The proving structure is configured to be deflected in the event of there being a potential difference. In addition, an electromechanical component is configured to generate a useful effect.

(Continued)

A method implements operation of an electromechanical component for proving the existence of a potential difference, other methods implement operation for performing a functional test on the electromechanical component.

34 Claims, 14 Drawing Sheets

(58) Field of Classification Search
CPC .... G01R 33/02; G01R 33/0286; G01R 29/12; G02B 6/3518; G02B 6/3656
See application file for complete search history.

(56) References Cited

U.S. PATENT DOCUMENTS

| | | | |
|---|---|---|---|
| 8,618,496 B2 | 12/2013 | Wieland et al. | |
| 9,030,723 B2 | 5/2015 | Wu et al. | |
| 9,082,581 B2 | 7/2015 | Matsumoto | |
| 9,164,277 B2* | 10/2015 | Conrad | H02N 1/006 |
| 2001/0001244 A1 | 5/2001 | Rhodes | |
| 2002/0153584 A1 | 10/2002 | Frazier et al. | |
| 2004/0169147 A1* | 9/2004 | Ono | B82Y 10/00 250/396 R |
| 2005/0242302 A1 | 11/2005 | Platzgummer et al. | |
| 2007/0024550 A1 | 2/2007 | Chui et al. | |
| 2007/0177418 A1 | 8/2007 | Pinkerton et al. | |
| 2008/0074728 A1 | 3/2008 | Ogikubo et al. | |
| 2013/0335487 A1* | 12/2013 | Cruz-Uribe | H01L 41/0993 347/69 |
| 2015/0348714 A1 | 12/2015 | Morris | |

FOREIGN PATENT DOCUMENTS

| | | |
|---|---|---|
| CN | 101593657 A1 | 12/2009 |
| CN | 103196889 A | 7/2013 |
| CN | 104391156 A | 3/2015 |
| JP | 2008-170160 A | 7/2008 |
| JP | 2016-509255 A | 3/2016 |

OTHER PUBLICATIONS

Korean language office action dated Sep. 26, 2019, issued in application No. KR 10-2018-7032779 and its English language translation.
International Search Report issued in application No. PCT/EP2017/058669 dated Jun. 22, 2017.
International Preliminary Examination Report issued in issued in application No. PCT/EP2017/058669 dated Jun. 27, 2018.
Huang et al.: "A novel high-sensitivity electrostatic biased electric field sensor"; Journal of Micromechanics & Microengineering, vol. 25; No. 9; Aug. 18, 2015; XP055380327, 10.1088/0960-1317/25/.
Chinese Office Action dated May 27, 2020, issued in application No. 201780036202.3.
English language translation of Chinese Office Action dated May 27, 2020, issued in application No. 201780036202.3.

* cited by examiner

ELECTROMECHANICAL COMPONENT, ELECTROMECHANICAL COMPONENT ARRANGEMENT, METHOD OF DETECTING A POTENTIAL DIFFERENCE BY USING AN ELECTROMECHANICAL COMPONENT, AND METHOD FOR PERFORMING A FUNCTIONAL TEST ON THE ELECTROMECHANICAL COMPONENT

CROSS-REFERENCE TO RELATED APPLICATIONS

This application is a continuation of copending International Application No. PCT/EP2017/058669, filed Apr. 11, 2017, which is incorporated herein by reference in its entirety, and additionally claims priority from German Application No. 102016206208.5, filed Apr. 13, 2016, which is also incorporated herein by reference in its entirety.

BACKGROUND OF THE INVENTION

An embodiment of the present invention relates to an electromechanical component. A further embodiment relates to an electromechanical component arrangement. Further embodiments relate to operational procedures and methods of performing functional tests on the electromechanical component. An embodiment of the invention relates to a device for proving an electrical potential by means of a mechanically deflectable plate.

In order to achieve further reduction in the size of integrated components, the technology used for manufacturing, for example lithography, needs to be constantly improved. Among other things, electron writing technology (electron beam lithography) may be considered to be excellently suited since it promises a very high resolution, which is used for extremely fine structuring. To accelerate the writing process, it is useful to employ a multitude of electron beams which may be controlled separately.

The general setup of a deflection matrix for charged particle beams with any number of individually controllable deflection cells was already described in a NuFlare patent (U.S. Pat. No. 9,082,581 B2). The architecture of the component on which the deflection cells described here are located is comparable to that described in NuFlare's patent. In this case, the possibility of proof via the mode of operation of the component is also missing.

The main problem of the setup, described herein, of the deflection matrix is the possibility to test and prove the functional capability of the deflection matrix and/or of the individual cells prior to delivery of the component to the client.

A proving method is used in order to show that, on the one hand, a voltage is actually applied when the deflection electrodes are being controlled, and that, on the other hand, no short circuits occur between different deflection electrodes. Consequently, what is in demand is a potential proving method for each individual deflection cell.

The most costly method of testing the mode of operation of the component is to set up the component and to install it into the application device. A simplified setup of the application device would also be feasible. In any case, however, a multitude of individual electron beams would have to be generated and be directed through the holes/apertures; subsequently, they would have to be deflected by controlling the component. Some kind of a detector is mounted on the other side of the device, which detector enables proving whether the individual electron beams can actually be deflected. Setting up such an application device would involve an extremely large amount of effort and does not provide a method that can be realized with simple means. Consequently, it would be possible to perform such a test only after delivery of the component, at the client on site.

In principle, scanning electron microscopes (SEM) offer the possibility of visualizing electrically charged regions within a component by means of a contrast in potential. However, it needs a large amount of effort to electrically contact, or control, a component to a sufficient extent while examining it by means of a scanning electron microscope at the same time.

With a view of the above illustrations, it is desirable to provide an electromechanical component, an electromechanical component arrangement, a method of operation and a method of performing a functional test, all of which enable performing simple functional tests (for example on a deflection matrix and/or on individual deflection cells).

SUMMARY

According to an embodiment, an electromechanical component may have: a first electrode; a second electrode; and an elastically deformable proving structure; wherein the first electrode and the second electrode are arranged to generate a useful electrical field in the event of there being a potential difference between the first electrode and the second electrode; and wherein the proving structure is configured to be deflected in the event of there being a potential difference between the first electrode and the second electrode; and wherein the electromechanical component is configured to have a useful effect, caused by the useful field, which differs from the deflection of the proving structure.

Another embodiment may have an electromechanical component arrangement, said electromechanical component arrangement having a plurality of inventive electromechanical components as mentioned above.

Another embodiment may have a method of operating an electromechanical component for detecting a potential difference having: a first electrode; a second electrode; and an elastically deformable proving structure; wherein the first electrode and the second electrode are arranged to generate a useful electrical field in the event of there being a potential difference between the first electrode and the second electrode; and wherein the proving structure is configured to be deflected in the event of there being the potential difference between the first electrode and the second electrode; and wherein the electromechanical component is configured to have a useful effect, caused by the useful field, which differs from the deflection of the proving structure; and wherein the method has controlling of the electromechanical component so as to obtain a potential difference; and wherein a deflection of the proving structure is detected so as to detect the existence of a potential difference between the first electrode and the second electrode.

According to still another embodiment, a method of performing a functional test on an inventive electromechanical component as mentioned above may have the steps of: controlling the electromechanical component such that with a functional component, a potential difference arises between the first and the second electrodes which is suited to generate the useful electrical field; and detecting a deflection of the proving structure; and deciding, as a function of the detection of the deflection, whether or not the electromechanical component is functional.

An embodiment of the present invention provides an electromechanical component comprising a first electrode, a second electrode, and an elastically deformable proving structure. The first electrode and the second electrode are arranged to generate a useful electrical field in the event of there being a potential difference between the first electrode and the second electrode. The proving structure is configured to be deflected in the event of there being a potential difference between the first electrode and the second electrode. The electromechanical component is configured to have a useful effect, caused by the useful field, which differs from the deflection of the proving structure.

Thus, the invention provides the possibility of directly proving the existence of a potential difference by detecting the deflection of a proving structure. In this context, an important feature of the invention consists in that the deflection of the proving structure differs from the useful effect (net efficiency) of the component. The advantage of the invention may therefore consist in that it is possible to verify that the useful effect may be achieved, in principle, without having to reproduce the useful effect in the functional test.

In accordance with an embodiment of the electromechanical component, the proving structure comprises a base surface and moreover a further surface, which is essentially perpendicular to the base surface, and an upper surface, which is essentially in parallel with the base surface. With this set up of the proving structure, one may achieve that the proving structure is detectably deflected even in case of a small potential difference between the first electrode and the second electrode. In addition, the above-mentioned setup may enable, in case the proving structure is mounted on one of the electrodes, manufacturing the other electrode with an increased height. Thus, for example, the distance resulting between the upper surface of the proving structure and the field-generating electrode that is responsible for the deflection of the proving structure may be selected more freely. Thus, for example, increased deflection of the proving structure may be achieved at a smaller potential difference.

In accordance with a further embodiment of the electromechanical component, the proving structure comprises at least one region having an elastic material. Here, too, the effect that the proving structure may be deflected more easily may result. Also, it is possible that due to the elasticity of parts of the proving structure or of the entire proving structure, fatigue strength is achieved and no or only negligible material fatigue will occur.

In accordance with a further embodiment of the electromechanical component, the proving structure comprises at least one region made of titanium or of aluminum or of titanium-aluminum or of aluminum-silicon-titanium. Utilization of the materials mentioned may be referred to as advantageous since they may exhibit several desired properties. On the one hand, they may comprise a desired degree of elasticity, and on the other hand, their conductivity may achieve a shielding effect on electrical fields.

In accordance with a further embodiment of the electromechanical component, the proving structure overlaps the first electrode such that a region of the proving structure, which is spaced apart from a mechanical attachment region of the proving structure, is located opposite a region of the first electrode. This has the advantage that the degree of deflection of the proving structure may be increased since a larger effective area of the proving structure may be located within the sphere of action of the field of an electrode, e.g. of the first electrode.

In accordance with a further embodiment of the electromechanical component, the proving structure comprises a deflection facilitation structure facilitating the deflection of the proving structure and/or reducing the bending strength of the proving structure. This offers the advantage that the deflection of the proving structure may be adjusted to have a desired degree.

In accordance with a further embodiment of the electromechanical component, the deflection facilitation structure is configured such that the proving structure achieves a desired shielding effect on the field emanating from the first electrode, apart from a shielding effect on the useful field. In addition, the deflection facilitation structure is configured to facilitate the deflection of the proving structure as compared to a proving structure which does not have the deflection facilitation structure. This offers the advantage that at least two desired properties of the proving structure can be improved. On the one hand, the proving structure may thus be mechanically manufactured such that at a desired potential difference between the first electrode and the second electrode, a desired degree of deflection occurs, and on the other hand, a shielding effect may also be desired. This would represent a compromise if the proving structure was manufactured accordingly. On the other hand, structures, which are introduced in a targeted manner for the purpose of facilitating deflection may provide sufficient elasticity, or plasticity, while degrading the shielding effect to a small degree only.

In accordance with a further embodiment of the electromechanical component, the deflection facilitation structure and/or parts of the deflection facilitation structure are arranged within (a) region(s) of the proving structure wherein an electrical field strength is smaller by at least 50 percent than it is within a region of a maximum field strength, which is located between the first electrode and the proving structure. This offers the advantage that the deflection facilitation structure may be provided in regions of the proving structure which make a smaller contribution to the shielding effect caused by the proving structure.

In accordance with a further embodiment of the electromechanical component, the proving structure comprises at least two slits, furthermore, the proving structure comprises a free end.

A first slit of extends from the free end of the proving structure to an inner region of the proving structure. A second slit extends from the free end of the proving structure to an inner region of the proving structure. The first slit and the second slit are provided at a mutual distance.

This embodiment has the advantage that a desired deflectability of the proving structure may be achieved. As was already mentioned, it is also possible in this context to take into account and positively influence the effect of shielding in the design of the proving structure and of the slits. By manufacturing the proving structure, which comprises at least two slits, in this manner, deflection may be clearly improved. In addition, it is possible for the shielding effect to also exist to a desired degree and/or to be reduced by a negligible degree only as a result of the slits.

In accordance with a further embodiment of the electromechanical component, the proving structure comprises at least two slits. In addition, the proving structure comprises a free end.

In this context, the first slit extends, in a first portion of the first slit, from the free end of the proving structure to an inner region of the proving structure. Following this, the first slit extends, within the inner region of the proving structure, in a second portion of the first slit, the first portion of the first slit and the second portion of the first slit encompassing an angle, said angle being larger than 45 degrees, advantageously larger than 70 degrees.

In addition, a second slit extends, in a first portion of the second slit, from the free end of the proving structure to an inner region of the proving structure. Following this, the second slit extends, within the inner region of the proving structure, in a second portion of the second slit, the first portion of the second slit and the second portion of the second slit encompassing an angle, said angle being larger than 45 degrees, advantageously larger than 70 degrees. The first slit and the second slit are provided at a mutual distance.

This embodiment has the advantage that a desired, yet again improved deflectability of the proving structure can be achieved. The second portions of the first slit and of the second slit, respectively, may provide for the yet again increased deflectability of the proving structure. Said portions provide for further facilitation of the deflection since that region which mechanically secures the proving structure may be reduced even more. As was already mentioned, the effect of shielding may also be taken into account in the design of the proving structure and of the slits, and consequently, one may achieve that the reduction of the shielding effect is within a negligible range.

In accordance with a further embodiment of the electromechanical component, the proving structure comprises at least three slits. In addition, the proving structure comprises a free end.

In this context, a first slit extends, in a first portion of the first slit, in an essentially straight manner from the free end of the proving structure to an inner region of the proving structure. Following this, the first slit extends, within the inner region of the proving structure, in an essentially straight manner in a second portion of the first slit, the first portion of the first slit and the second portion of the first slit encompassing an angle, said angle being larger than 45 degrees, advantageously larger than 70 degrees.

A second slit extends, in a first portion of the second slit, in an essentially straight manner from the free end of the proving structure to the inner region of the proving structure. Following this, the second slit extends, within the inner region of the proving structure, in an essentially straight manner in a second portion of the second slit, the first portion of the second slit and the second portion of the second slit encompassing an angle, said angle being larger than 45 degrees, advantageously larger than 70 degrees.

In addition, a third slit extends within the inner region of the proving structure, said third slit being adjacent to the second portion of the first slit and to the second portion of the second slit.

In this context, the second portion of the first slit extends, within a region adjacent to a first portion of the third slit, essentially in parallel with the first portion of the third slit, and the second portion of the second slit extends, within a region adjacent to a second portion of the third slit, essentially in parallel with the second portion of the third slit. The first portion of the third slit merges into the second portion of the third slit.

This embodiment has the advantage that a desired, yet again improved deflectability of the proving structure can be achieved. The resulting structure may have the effect of a rotary joint, said effect being desired for increasing the level of deflectability. In addition, it is advantageous that said clearly improved deflectability may be achieved with a very small reduction of the shielding surface since the slits which may form a rotary joint have a very small space requirement. As was already mentioned, it is also possible in this context to take into account the effect of shielding in the design of the proving structure and of the slits.

In accordance with a further embodiment of the electromechanical component, the proving structure is configured to achieve a desired shielding effect on a field emanating from the first electrode, apart from a shielding effect on the useful field. This offers the advantage that the useful effect which is based on the existence, or controllability, of the useful electrical field is not restricted, but that only undesired portions of the field which emanates from, e.g., the first electrode are shielded off.

In accordance with a further embodiment of the electromechanical component, the first electrode is arranged on a substrate, and the proving structure overlaps the first electrode such that the first electrode is located at least partly between the proving structure and the substrate so as to achieve a desired shielding effect on the field emanating from the first electrode, apart from a shielding effect on the useful field. The embodiment described may have the advantage that it is possible, by mutually arranging the proving structure, the first electrode and the substrate in a skillful manner, that the useful effect is influenced to a small degree only and that the deflectability of the proving structure may be improved at the same time and that the shielding effect caused by the proving structure may also be improved.

In accordance with a further embodiment of the electromechanical component, the proving structure comprises several portions located opposite several lateral surfaces of the first electrode so as to shield the first electrode off toward several directions. This offers the advantage that the shielding effect may be further improved; also, the deflection of the proving structure may be improved and, thus, for example, the detectability of the potential difference between the first electrode and the second electrode may also be improved.

In accordance with a further embodiment of the electromechanical component, the first electrode and/or the second electrode are raised as compared to a main surface of the substrate. This offers the advantage that, e.g., the proving structure may be applied to the second electrode in the form of unessentially planar surface, and that therefore, producibility may be simplified. It is also possible that due to the application of the proving structure to the second electrode, the electrical coupling of the second electrode to the proving structure may be improved. Moreover, the useful electrical field between the first electrode and the second electrode may possibly become more pronounced.

In accordance with a further embodiment of the electromechanical component, the second electrode is higher, in relation to a main surface of the substrate, than the first electrode. This may offer the further advantage that the proving structure may be manufactured as an essentially planar surface on the second electrode. In addition, the first electrode may be manufactured such that it is adjacent to the second electrode. In this manner, one may achieve that the proving structure overlaps the first electrode, and one may achieve a high level of deflectability. In this manner, the shielding effect caused by the proving structure may also be increased.

In accordance with a further embodiment of the electromechanical component, the first electrode and the second electrode are located opposite each other. This offers the advantage that the useful effect may also be achieved to a desired degree even at a low potential difference.

In accordance with a further embodiment of the electromechanical component, the first electrode and the second electrode are configured such that the useful field is suited to influence at least one mechanical structure, the mechanical structure differing from the proving structure. This offers the advantage that the useful effect implements a function similar to the deflection of a proving structure. Therefore, an adjustment of a mechanical element would also be feasible.

In accordance with a further embodiment of the electromechanical component, the first electrode and the second electrode are configured such that the useful field is suited to influence electromagnetic radiation and/or individual photons. This offers the advantage that one may achieve that electromagnetic radiation is influenced. This may enable many further modes of using the electromechanical component.

In accordance with a further embodiment of the electromechanical component, the first electrode and the second electrode are configured such that the useful field is suited to influence a particle beam. What would be advantageous about this would be, for example, that it may be possible to separate charged and uncharged particles.

In accordance with a further embodiment of the electromechanical component, the first electrode and the second electrode are configured such that the useful field is suited to deflect or to influence a particle beam of charged particles. This offers the advantage that, e.g., a mode of use is feasible wherein a particle beam is directed onto a further material in order to structure said material.

In accordance with a further embodiment of the electromechanical component, the electromechanical component comprises a substrate. The first electrode and the second electrode are located opposite each other at a distance. The substrate comprises an opening in a region between the first electrode and the second electrode. This offers the advantage that a particle beam may pass through the opening and, thus, e.g., also through the substrate.

In accordance with a further embodiment of the electromechanical component, the opening is configured to enable a particle beam to pass through the electromechanical component. The first electrode and the second electrode are configured such that the electrical useful field is suited to influence a particle beam. This offers the advantage that a particle beam may be influenced by the useful field between the first electrode and the second electrode and that said particle beam may subsequently pass, e.g., through the opening and, thus, through the entire substrate. By means of this embodiment, the trajectory of the particle beam may be changed toward any direction desired, for example, without having to directly influence a source of the particle beam in any manner.

In accordance with a further embodiment of the electromechanical component, the first electrode and the second electrode are configured such that the useful field is suited to deflect a particle beam, and the opening is configured such that a particle beam passes through the opening at a first operational potential difference. In addition, the opening is configured such that a particle beam is eliminated at a second operational potential difference. The first operational potential difference differs from the second operational potential difference. This offers the advantage that a particle beam of charged particles may be "switched on" and "switched off" by the influence of the first electrode and of the second electrode, or, by analogy, by the electromechanical component, without it being necessary to influence the source of the particle beam.

In accordance with a further embodiment of the electromechanical component, the second electrode and the proving structure are electrically coupled to a reference potential supply of a circuit. Moreover, the first electrode is configured to comprise a potential different from the reference potential of the circuit. This offers the possibility that the deflection of the proving structure can provide proof of the existence of a potential difference between the first electrode and the second electrode. Also, this device may enable the proving structure to exert an improved shielding effect on the field of the first electrode. Moreover, by means of this device one may achieve that controlling may be clearly simplified.

In accordance with an embodiment of the electromechanical component, the electromechanical component arrangement comprises a plurality of electromechanical components. This offers the advantage that a multitude of electromechanical components may achieve the useful effect. For example, an application would be feasible wherein a multitude of electron beams may be individually "switched on" or "switched off" as need be.

In accordance with an embodiment of the electromechanical component, the electromechanical components are arranged on a substrate, and the electromechanical components are arranged in both spatial directions of the surface of the substrate. This offers the advantage that, e.g., electron beams which are arranged in a distribution comparable to that of the electromechanical components may be influenced.

In accordance with an embodiment of the electromechanical component, the electromechanical component arrangement comprises a row and/or column structure, and a respective row and/or a respective column comprises a plurality of electromechanical components. This offers the advantage that, e.g., several electron beams, which may be arranged in some kind of matrix, may be influenced at the same time. In this context, application is not limited to simultaneous influencing of all of the electron beams; in the embodiment, it is also feasible that individual electron beams may be influenced in a targeted manner.

In accordance with an embodiment of the electromechanical component, the electromechanical component arrangement comprises at least two electromechanical components, and a first electromechanical component comprises a first electrode, a second electrode, and an elastically deformable proving structure.

The first electrode of the first electromechanical component and the second electrode of the first electromechanical component are arranged to generate a first useful electrical field in the event of there being a potential difference between the first electrode of the first electromechanical component and the second electrode of the first electromechanical component.

Moreover, the proving structure of the first electromechanical component is configured to be deflected in the event of there being a potential difference between the first electrode of the first electromechanical component and the second electrode of the first electromechanical component, and the first electromechanical component is configured to have a useful effect, caused by the useful field, which differs from the deflection of the proving structure of the first electromechanical component.

A second electromechanical component comprises a first electrode and a second electrode and an elastically deformable proving structure.

The first electrode of the second electromechanical component and the second electrode of the second electromechanical component are arranged to generate a second useful electrical field in the event of there being a potential difference between the first electrode of the second electromechanical component and the second electrode of the second electromechanical component.

Furthermore, the proving structure of the second electromechanical component is configured to be deflected in the event of there being the potential difference between the first electrode of the second electromechanical component and the second electrode of the second electromechanical component. In addition, the second electromechanical component is configured to have a useful effect, caused by the useful field, which differs from the deflection of the proving structure of the second electromechanical component.

Moreover, the second electrode of the first electromechanical component is provided adjacently to the first electrode of the second electromechanical component.

This offers the advantage that the second electrode of a first component may shield off the first electrode of a second component, so that crosstalk of an undesired electrical field to other regions may be shielded off.

In accordance with an embodiment of the electromechanical component, the proving structure of the second electromechanical component is provided on the second electrode of the first electromechanical component. This offers the advantage that space saving may be achieved since the proving structure may be arranged on a second electrode of an adjacent electromechanical component and need not be arranged, e.g., on the substrate.

In accordance with an embodiment of the electromechanical component, the second electrode of the first electromechanical component is manufactured such that each of three sides of the first electrode of the second electromechanical component has one side of the second electrode of the first electromechanical component located opposite it. This offers the advantage that very good shielding of an undesired field of the first electrode may be achieved since the latter is surrounded, toward several sides, by a second electrode of an adjacent electromechanical component, which second electrode may be switched to the reference potential of the entire component arrangement, for example.

In accordance with an embodiment of the electromechanical component, the proving structure of the second electromechanical component is provided on the second electrode of the first electromechanical component, and the first electrode of the second electromechanical component is located at least partly between the proving structure of the second electromechanical component and the substrate. This offers the advantage that the proving structure may achieve a very high shielding effect and that simultaneously, a high degree of deflection of the proving structure may be achieved at a low potential difference between the first electrode and the second electrode.

The method mentioned implements the operation intended of the above-described electromechanical component and/or of the electromechanical component arrangement.

An embodiment provides a method of operating an electromechanical component for detecting a potential difference. The electromechanical component comprises a first electrode, a second electrode, and an elastically deformable proving structure.

The first electrode and the second electrode are arranged to generate a useful electrical field in the event of there being a potential difference between the first electrode and the second electrode, and the proving structure is configured to be deflected in the event of there being the potential difference between the first electrode and the second electrode. In addition, the electromechanical component is configured to have a useful effect, caused by the useful field, which differs from the deflection of the proving structure.

Moreover, the method comprises driving of the electromechanical component so as to obtain a potential difference; a deflection of the proving structure being detected so as to detect the existence of a potential difference between the first electrode and the second electrode.

This method offers the advantage that it may consequently provide evidence of a potential difference between the first electrode and the second electrode.

A further embodiment provides a method of performing a functional test on an electromechanical component, the method comprising:

controlling the electromechanical component such that with a functional component, a potential difference arises between the first and the second electrodes which is suited to generate the useful electrical field. In addition, detecting a deflection of the proving structure, and deciding, as a function of the detection of the deflection, whether or not the electromechanical component is functional.

This method offers the advantage that the functionality of the electromechanical component may be ascertained. In this context, it would also be feasible for the deflection of an individual proving structure to be quantitatively detected and that, therefore, one may infer the type of a possible manufacturing defect of the electromechanical component. It would be feasible, for example, for a missing deflection of the proving structure to be able to indicate defective or missing contacting of an electrode.

A further embodiment provides a method of performing a functional test on an electromechanical component, wherein the decision is made irrespectively of whether or not the useful effect, which differs from the deflection of the proving structure, exists. This offers the advantage that the functionality of the electromechanical component may be ascertained with a minimum amount of expenditure without having to reproduce, e.g., the useful effect of a testing device.

A further embodiment provides a method of operating the electromechanical component, wherein the deflection of the proving structure is detected optically and/or electrically. This method offers the advantage that the deflection may be detected in a suitable manner depending on the field of application. Optical or electrical detection may exhibit advantages over the respectively other type of detection.

A further embodiment provides a method of operating the electromechanical component, wherein the deflection of the proving structure is detected by means of a white-light interferometer or of a light microscope. This method offers the advantage that types of detection which are easy to apply are suitable for verifying the deflection of the proving structure.

A further embodiment provides a method of operating the electromechanical component, wherein the deflection of the proving structure that is due to the potential difference between the first electrode and the second electrode is at least 3 nm, advantageously 5 nm to 100 nm, most advantageously 20 nm to 40 nm. This method offers the advantage that due to the significant deflection of the proving structure, misinterpretation of a measurement error may excluded within a wide range.

A further embodiment provides a method of operating the electromechanical component, wherein, at a potential difference between the first electrode and the second electrode of up to 10 V, advantageously up to 5 V, the deflection of the proving structure will be within a desired range. This method offers the advantage that overstressing of the proving structure and/or of the electromechanical component may be avoided.

A further embodiment provides a method of operating the electromechanical component, wherein the potential difference between the first electrode and the second electrode switches between 0 V and 5 V during operation.

BRIEF DESCRIPTION OF THE DRAWINGS

Embodiments of the present invention will be explained below in more detail with reference to the accompanying figures, wherein.

DETAILED DESCRIPTION OF THE INVENTION

Various possible embodiments in accordance with the present invention which may implement, e.g., the invention of a proving structure (of a deflectable crosstalk shield) will be listed below.

Figure 1:
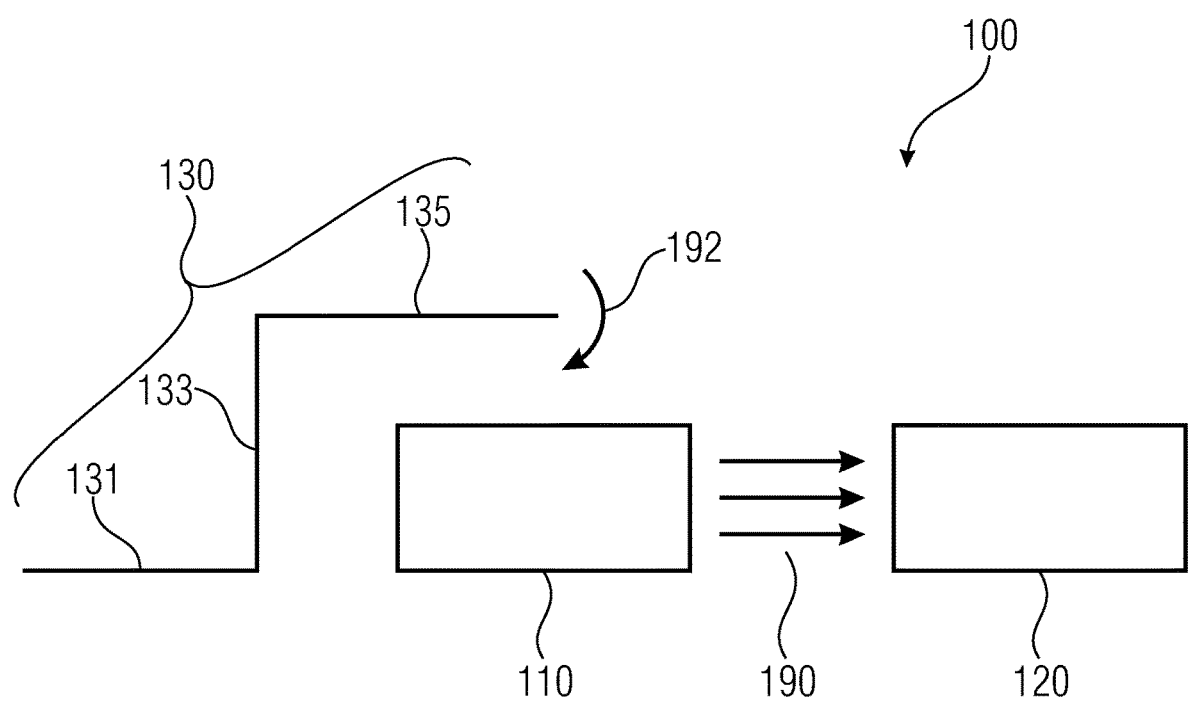
FIG. 1 shows a schematic sectional view of an electromechanical component in accordance with a first embodiment of the present invention.

Embodiment of FIG. 1

FIG. 1 shows a schematic sectional view of an electromechanical component 100 in accordance with a first embodiment of the present invention. The electromechanical component 100 includes a first electrode 110, a second electrode 120, and an elastically deformable proving structure 130. The first electrode 110 and the second electrode 120 are arranged to generate a useful electrical field in the event of there being a potential difference between the first electrode 110 and the second electrode 120. The proving structure 130 is configured to be deflected, for example by an electrostatic force, in the event of there being the potential difference between the first electrode 110 and the second electrode 120. The electromechanical component 100 is configured to have a useful effect, caused by the useful field, which differs from the deflection of the proving structure 130.

In other words, it may be said that by means of the above-described proving structure 130, a description is given of a mechanical setup of a plate, i.e. of the proving structure 130, which may be conductively connected to an electrode, e.g. the second electrode 120, and is located at a defined distance from a first electrode 110. The setup may be selected such that the plate 130 may be deflected as soon as there is a certain minimum potential difference between the two electrodes, i.e. the first electrode 110 and the second electrode 120.

It would also be feasible to manufacture a comparable component wherein several electrodes may also be responsible for the deflection of the plate 130. This may be understood to mean, for example, that several electrodes take on the task of the first electrode 110. The so-called electrodes 110, 120 may evidently also be replaced by conductor tracks or the like.

In other words, one may state that the proving structure 130, which may also be referred to as a plate, may be geometrically constructed such that measurable deflection is achieved. Thus, the deflection of the proving structure 130 may be used as proof of the existence of a potential difference between the two electrodes, i.e. the first electrode 110 and the second electrode 120.

Figure 2:
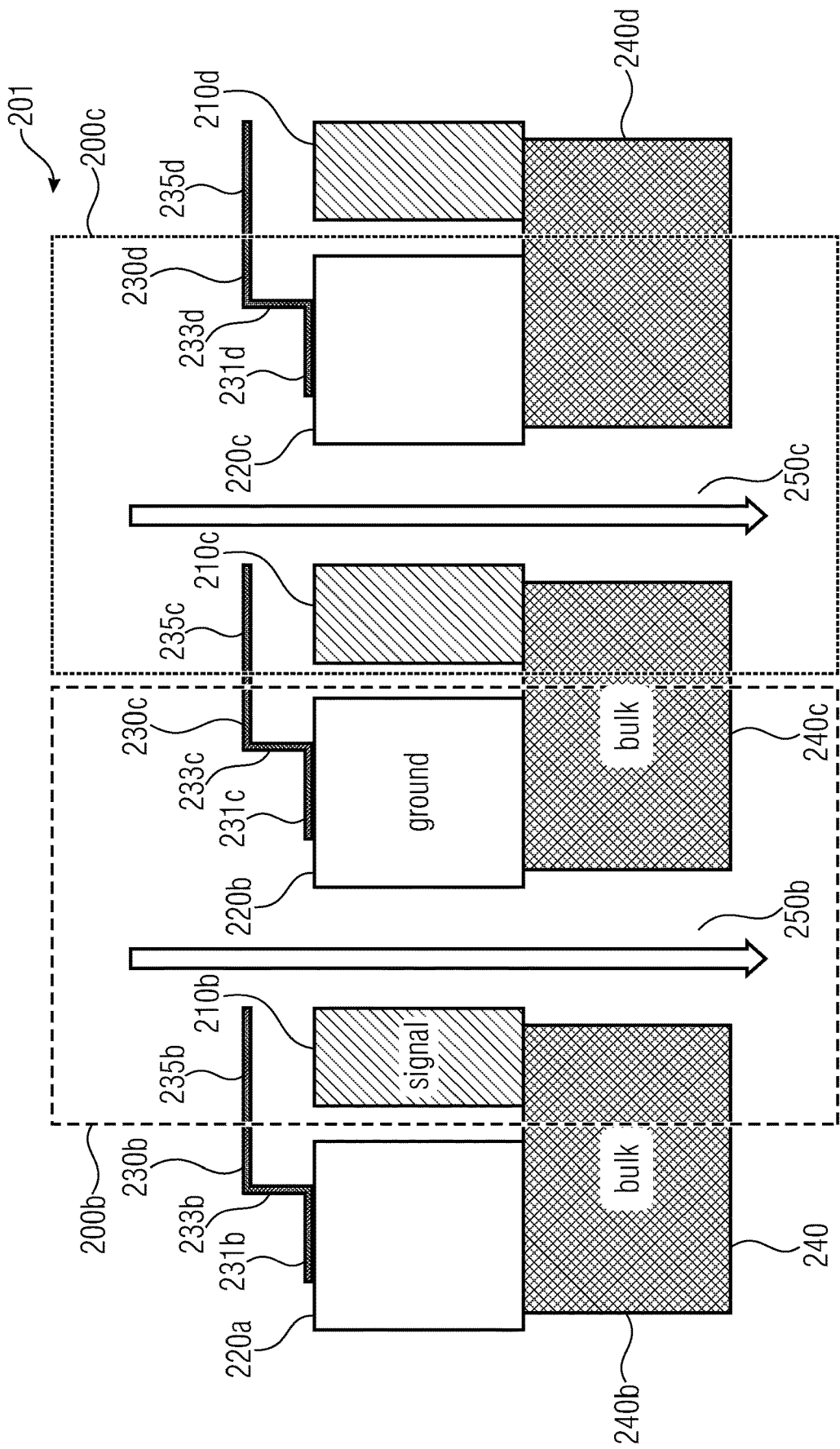
FIG. 2 shows a schematic sectional view of an electromechanical component in accordance with a second embodiment of the present invention.
Figure 3:
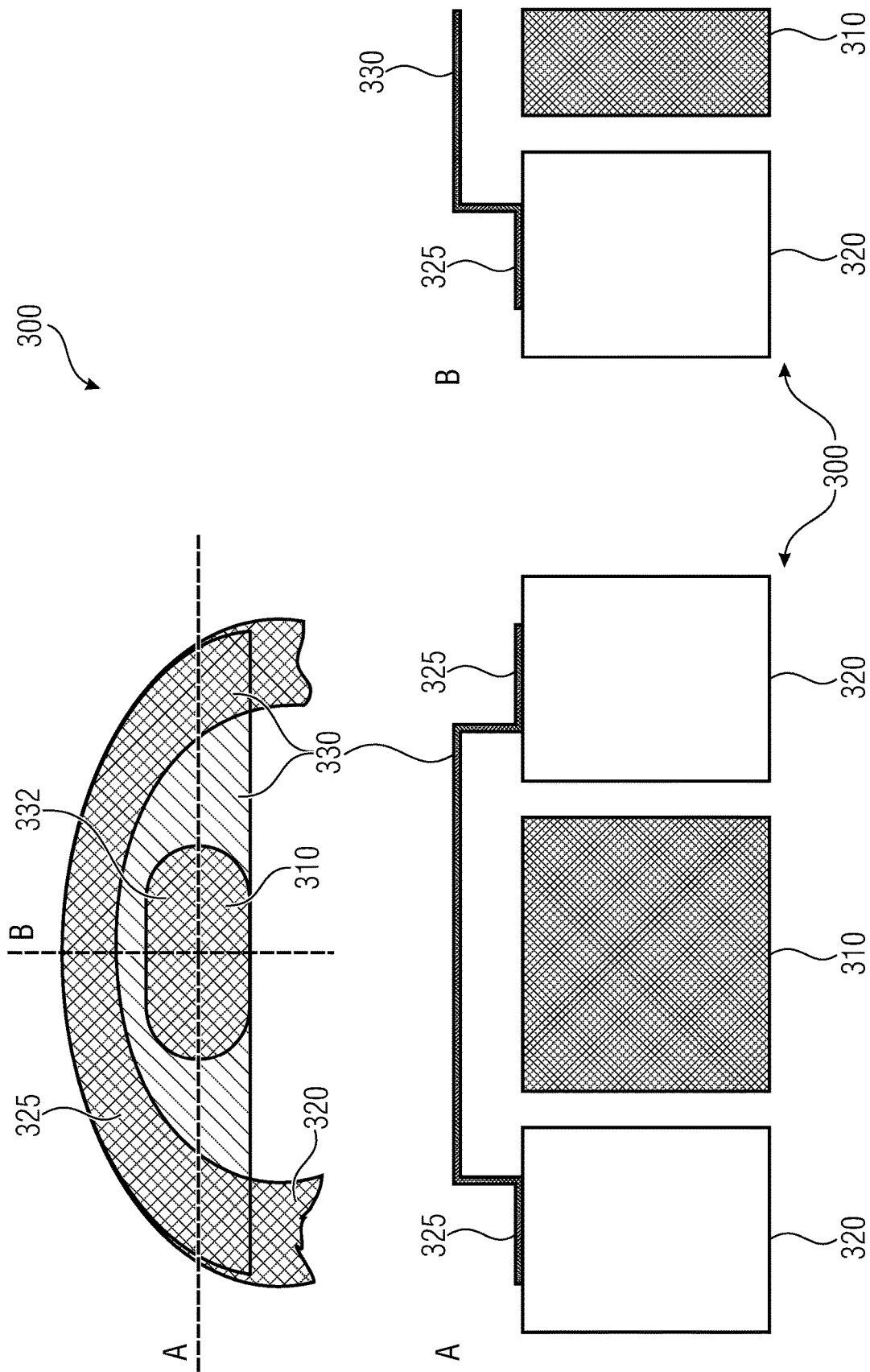
FIG. 3 shows a schematic top view and two schematic sectional views of an electromechanical component in accordance with a third embodiment of the present invention.

As is depicted in FIG. 1, the proving structure 130 may be subdivided into several regions, or portions; in this context, the implementation represented is not mandatory—depending on the arrangement of the electrodes 110, 120 or on other requirements, a different setup of the proving structure 130 may be advantageous. In FIG. 1, the proving structure 130 comprises a base surface 131, which may represent, for example, mechanical anchorage with an underlying structure. It would be feasible, for example, for the base surface 131 to be mounted on a substrate or the like. Other embodiments, e.g. the embodiments of FIG. 2, FIG. 3, FIG. 4, show the possibility that the proving structure be mounted on any of electrodes 110, 120. In addition, the proving structure comprises a further surface 133, which is essentially perpendicular to the base surface, which means that the further surface deviates by a maximum of 20 degrees from a perpendicular to the base surface 131. Moreover, the proving structure comprises an upper surface 135 essentially in parallel with the base surface 131, which means that the upper surface 135 may deviate by up to 10 degrees from exact parallelism in relation to the base surface 131.

In the embodiment, the proving structure 130 is arranged adjacently to the first electrode 110 such that the upper surface 135 of the proving structure 130 partly overlaps the first electrode 110. This means that in the event of a projection of the upper surface 135, in correspondence with a suitable normal to surface of the upper surface 135, at least partial matching of the projected surface with the surface of the first electrode 110 may be found. In addition, the proving structure 130 may be arranged such that in the region of the desired deflection of the proving structure 130, no point of contact results between one part or several parts of the proving structure 130 and of the first electrode 110. The second electrode 120 is arranged adjacently to the first electrode 110 such that, e.g., a useful electrical field may form, to a suitable degree, between the first electrode 110 and the second electrode 120 due to a potential difference between electrodes 110, 120.

It has not been mentioned so far that the proving structure 130 may also be used as a structure for shielding. For this reason, the proving structure 130 may also be referred to as a crosstalk shield below. This task of the proving structure 130 may also be taken into account in the design of the electromechanical component 100. Basically, one may state that one may attempt to find a compromise between the shielding effect and the proving-structure function. The compromise relates, above all, to the geometrical implementation of the proving structure 130. For example, a readily deflectable proving structure 130 may be achieved by a setup consisting of narrow, elastic, and thus easily deformable, surfaces. However, utilization of narrow surfaces may in turn entail a poorer shielding effect. With regard to the placement of the proving structure 130, the shielding effect of the proving structure 130 may be referred to as being very good, in principle, since the proving structure 130 should be placed in a region having a relatively high field strength anyway in order to achieve significant deflection. Thus, it may be possible that by means of the invention presented, the two above-mentioned goals of deflection and shielding effect may be combined with each other to a large extent.

At the same time, the proving structure 130 may also perform the function of a crosstalk shield. These proving structures and their shielding effects may be employed, e.g., in an area as described in U.S. Pat. No. 8,618,496 B2 for multi-beam lithography systems.

For example, the inventive proving structure 130 may act as a proving structure (crosstalk shield) within an electrostatic micro-electromechanical system (MEMS), which proving structure is to reduce crosstalk between two adjacent electrodes in that ground planes cover opposing sides of electrodes. The shielding effect may be designed in a manner that is similar, e.g., to that described in U.S. Pat. No. 7,723,810 B2.

The invention indicated here provides for implementing the potential-proving method and, thus, the function-proving method for example by means of the crosstalk shield and/or for having the proving structure 130 also perform the task of shielding.

In FIG. 1, the useful effect is indicated by three arrows 190 pointing from the first electrode 110 to the second electrode 120. Said arrows 190 may also be regarded as field lines of a useful electrical field. The distribution of the arrows 190 allows no qualitative or quantitative conclusion as to the electrical field which is actually forming. A further, individual arrow 192 associated with the proving structure 130 is to indicate a possible deflection of the proving structure 130.

The useful effect which may be achieved by the electromechanical component 100 may be, e.g., deflection of a particle beam of charged particles, such as of an electron beam. A useful effect which might also be achieved would be, e.g., deflection of a micro-electromechanical structure (MEMS). Since the electromechanical component 100 exerts the useful effect via a useful electrical field, applications would be feasible, in principle, which are based on the underlying precondition of the existence or the controllability of an electrical field.

Embodiment of FIG. 2

FIG. 2 shows a schematic sectional view of an electromechanical component arrangement 201 in accordance with a second embodiment of the present invention.

The embodiment comprises a plurality of first electrodes 210b, 210c, 210d, a plurality of second electrodes 220a, 220b, 220c, and a plurality of proving structures 230b, 230c, 230d. A respective proving structure 230b, 230c, 230d comprises a base surface 231b, 231c, 231d, a further surface 233b, 233c, 233d, which is essentially perpendicular to the base surface 231b, 231c, 231d, and an upper surface 235b, 235c, 235d, which is essentially in parallel with the base surface 231b, 231c, 231d.

In FIG. 2, a substrate (bulk) 240 is depicted which in the representation of the sectional view is subdivided into three portions 240b, 240c, 240d due to the existence of two openings 250b, 250c. A first electrode 210b, 210c, 210d and a second electrode 220a, 220b, 220c, respectively, are located on each of the three portions. A respective second electrode 220a, 220b, 220c has a proving structure 230b, 230c, 230d mounted thereon which in turn comprises a base surface 231b, 231c, 231d, a further surface 233b, 233c, 233d, and an upper surface 235b, 235c, 235d.

Moreover, in FIG. 2, a first electromechanical component 200b is indicated by a dashed line, and a second electromechanical component 200c is indicated by a dotted line.

Association of the elements with the electromechanical component 200b may be defined as follows: the proving structure 230b is mechanically provided on a second electrode 220a, said second electrode 220a not belonging to the electromechanical component 200b but to an electromechanical component which may adjoin toward the left. Nevertheless, the proving structure 230b may be electrically coupled to the second electrode 220a, which in turn may be coupled to a reference potential supply. The proving structure 230b is associated with the first electrode 210b, which is located between the substrate 240b and the upper surface 235b of the proving structure 230b. A useful effect may emanate from a useful electrical field, which may form between the first electrode 210b, which is inscribed by signal, and the second electrode 220b which is adjacent toward the right, is located on the other side of the opening 250b and is inscribed by ground, due to a potential difference between the two electrodes 210b, 220b.

FIG. 2 also shows an opening 250b arranged between the two electrodes 210b, 220b. A particle beam which may be influenced by the useful electrical field may pass through this opening 250b and, thus, also through the substrate 240.

In the embodiment, the second electrode 220a may have a shielding effect on an undesired portion of the electrical field of the first electrode 210b so as to reduce crosstalk. The proving structure 230b may also have a comparable effect and may reduce crosstalk of the electrical field of the first electrode 210b. In the embodiment, the second electrode 220b is used for mechanically securing a further proving structure 230c associated with an electromechanical component 200c.

Association of the elements with the electromechanical component 200c may be defined as follows: the proving structure 230c is mechanically provided on a second electrode 220b, said second electrode 220b not belonging to the electromechanical component 200c but to the electromechanical component 200b which adjoins toward the left. Nevertheless, the proving structure 230c may be electrically coupled to the second electrode 220b, which in turn may be coupled to a reference potential supply. The proving structure 230c is associated with the first electrode 210c, which is located between the substrate 240c and the upper surface 235c of the proving structure 230c. A useful effect may emanate from a useful electrical field, which may form between the first electrode 210c and the second electrode 220c which is adjacent toward the right and is located on the other side of the opening 250c, due to a potential difference between the two electrodes 210c, 220c.

FIG. 2 also shows an opening 250c arranged between the two electrodes 210c, 220c. A particle beam which may be influenced by the useful electrical field may pass through this opening 250c and, thus, also through the substrate 240.

In the embodiment, the second electrode 220b may have a shielding effect on an undesired portion of the electrical field of the first electrode 210c so as to reduce crosstalk. The proving structure 230c may also have a comparable effect and may reduce crosstalk of the electrical field of the first electrode 210c, for example to the electromechanical component 200b. In the embodiment, the second electrode 220c is used for mechanically securing a further proving structure 230d which may be associated with an electromechanical component 200d, for example, which is not depicted.

By arranging the electromechanical components 200b, 200c in a multiply adjacent manner, the entire arrangement may be reduced in size, for example, since the proving structure 230b, 230c, 230d may be mounted on an adjacent second electrode 220a, 220b, 220c. In terms of the mode of operation of the proving structure 230b, 230c, 230d, it may be useful in this context for the proving structure 230b, 230c, 230d to have the same potential as the second electrode 220a, 220b, 220c, which may be readily achieved by means of the mechanical connection.

In addition, the electromechanical components 200b, 200c are manufactured such that the proving structures 230b, 230c, 230d overlap the first electrodes 210b, 210c, 210d such that regions of the proving structures 230b, 230c, 230d, e.g. the upper surfaces 235b, 235c, 235d, which are spaced apart from a mechanical attachment region, for example from the base surfaces 231b, 231c, 231d, of the proving structure 230b, 230c, 230d, are located opposite a respective region of the first electrodes 210b, 210c, 210d, e.g. are parallel or form a small angle, e.g. smaller than or equal to 10 degrees.

In this context, a distance between the respective proving structure 230b, 230c, and/or between the respective upper surface 235b, 235c and the respective first electrode 210b, 210c may be selected such that in the event of there being an operational potential difference between the first electrode 210b, 210c and the second electrode 220b, 220c, an electrostatic force acting upon the proving structure 230b, 230c is sufficiently large to achieve deflection of the proving structure 230b, 230c or, e.g., of a region of the proving structure 230b, 230c, for example of the upper surface 235b, 235c, by more than 10 nm.

In other words, FIG. 2 depicts a setup of the electrodes 210b, 210c, 210d, 220a, 220b, 220c, for example for deflecting electron beams. The second electrode 220a, 220b, 220c (alternatively referred to as the ground electrode) may have a proving structure 230b, 230c, 230d (alternatively referred to as a crosstalk shield) located thereon, respectively.

Here, a proving structure 230b, 230c, 230d may be associated with a first electrode 210b, 210c, 210d. A first electrode 210b, 210c may form a deflection cell together with a second electrode 220b, 220c. The proving structure 230b, 230c, 230d may be mounted on a respective second electrode 220a, 220b, 220c. However, this is not mandatory. In the embodiment, it can be seen that the proving structure 230b, 230c, 230d is mounted on a second electrode 220a, 220b, 220c of an adjacent deflection cell. The first electrode 210b, 210c, 210d is at least partly covered by the corresponding proving structure 230b, 230c, 230d. The second electrode 220b, 220c, which may generate a useful electrical field together with the first electrode 210b, 210c, is available as a mechanical location of attachment of a proving structure 230c, 230d, which in turn is associated with an adjacent deflection cell. This arrangement is not mandatory either. Depending on the useful effect of the useful electrical field, a different arrangement may be advantageous as compared to the one indicated above.

In this context, reference shall also be made to the possibility that the second electrode 220a, 220b, 220c on which the proving structure 230b, 230c, 230d, which may also be referred to as a plate, may be anchored in a conducting manner may be permanently switched to reference potential, i.e. ground potential, during operation. Thus, both the proving structures 230b, 230c, 230d and the second electrodes 220a, 220b, 220c may be defined to have a common reference potential. This may offer an advantage to the effect that any first electrode 210b, 210c, 210d may cause a deflection of an associated proving structure 230b, 230c, 230d due to a potential difference in relation to the reference potential.

The respective proving structure 230b, 230c, 230d may also be used as a crosstalk shield. On an explanatory note it may be indicated that crosstalk of the electric field is to be prevented by a so-called crosstalk shield. FIG. 2 illustrates the setup of the electrodes 210b, 210c, 210d, 220a, 220b, 220c with a possible crosstalk shield 230b, 230c, 230d. The crosstalk shield 230b, 230c, 230d may be connected to reference potential in a conducting manner and may consist of a conductive material itself. Titanium, aluminum or alloys thereof (e.g. titanium-aluminum, TiAl or AlSiTi) may be used for implementing the crosstalk shield.

In the implementation described it is to be noted that the electrodes 210b, 210c, 210d are covered by the architecture of a crosstalk shield 230b, 230c, 230d, as a result of which it is no longer possible to provide proof of a charged region by means of the potential contrast of a scanning electron microscope (SEM). Therefore, detection of the potential difference by means of a proving structure 230b, 230c, 230d (also, e.g., by means of a crosstalk shield designed for this purpose) may present a reasonable alternative.

In FIG. 2, a dotted and/or the dashed line characterizes a "cell", or an electromechanical component 200b, 200c, respectively, a possible function of which will be briefly explained once again. In the selected embodiment, the useful function achieved by the useful field may represent exerting an influence on an electron beam. Said electron beam is represented by arrows located between the first electrode 210b, 210c and the second electrode 220b, 220c. Thus, a respective first electrode 210b, 210c may represent, in the substrate 240, a "deflection cell" together with a respective second electrode 220b, 220c and with a respective opening 250b, 250c, which "deflection cell" performs the function of deflecting a particle beam, for example. Of course, the useful function is not restricted to deflecting a particle beam. Rather, the setup may achieve an effect which needs the existence and/or controllability of an electrical field, which in this invention is referred to as a useful (electrical) field.

Embodiment of FIG. 3

The electromechanical components (deflection cells) described in a top view below relate to the setup of the proving structures, such as the setup of the proving structures as depicted in the inventive example of FIG. 7, but may also be transferred, by analogy, to the inventive example of FIG. 8.

FIG. 3 shows a schematic top view and two schematic sectional views of an electromechanical component 300, or parts thereof, in accordance with a third embodiment of the present invention. In the top region, an individual, e.g., deflection cell is depicted in a top view. In the bottom region, the corresponding sectional views are shown along the sections A and B.

In this context, the top view shows a possible manifestation of a first electrode 310 and a second electrode 320, which also serves to attach a proving structure 330. In the embodiment, the second electrode 320 is depicted to be oval in the top view; it would also be feasible to produce the second electrode 320 in the shape of pi, both may improve a desired shielding effect exerted by the second electrode 320. What is meant by the shape of a pi is that the corresponding element comprises three structural elements, wherein a first, essentially straight, structure comprises, at the respective ends, two essentially straight structures which are arranged essentially perpendicularly to the first structure. This second structure and third structure essentially extend only on one side of the first structure. Moreover, this second structure and third structure are arranged essentially symmetrically to an axis of symmetry of the first structure.

Moreover, the top view depicts a joining surface 325 which may be regarded as a mechanical joining surface, possibly also a surface directed toward an electrical coupling, between the second electrode 320 and the proving structure 330. This joining surface 325 may also correspond to a base surface, in accordance with the base surface 131 in FIG. 1 and/or a base surface 231 in FIG. 2 and/or base surfaces of the proving structures of other embodiments; in this context, the proving structure 330 would correspond to a special case, e.g., of the proving structure 130, with an infinitesimal further surface 133. In addition, the top view indicates that the proving structure 330 may comprise a deflection facilitation structure 332 which may facilitate deflection of the proving structure 330, for example as a result of an electrostatic force.

The two bottom sectional views in FIG. 3 show sectional views of the electromechanical component 300, in correspondence with sections A and B. The sectional views each also depict the first electrode 310, which in this embodiment is manufactured to be less high than the second electrode 320 and is enclosed on three sides by the second electrode 320. As a result of this selection, it may be possible to produce the proving structure 330 as an essentially planar surface, i.e. with a deviation of less than 10% from a planar surface. This may result, e.g., in clearly simplified manufacturing of the proving structure 330, for example as compared to a proving structure 230 of FIG. 2, which comprises a base surface 231, a further surface 233 essentially perpendicular to the base surface, and an upper surface 235 essentially in parallel with the base surface.

The proving structure 330 may be connected, in the embodiment, to the second electrode 320 via a surface 325. As is depicted in the top view of FIG. 3, this may be spread across several surface portions of the second electrode 320, which is not mandatory, however. A counter example may be indicated in FIG. 1. In FIG. 1, the proving structure 130, or the base surface 131, is not mechanically connected to a second electrode 120, even though an electrical coupling between the proving structure 130 and the second electrode 120 may make sense. By providing the proving structure 330 on the second electrode 320, a desirable reduction in the size of the electromechanical component 300 may be achieved, and this may represent an advantage of the depicted embodiment of FIG. 3 as compared to a different embodiment wherein a proving structure is not provided on a second electrode.

The electromechanical component 300 may be manufactured such that the proving structure 330 comprises at least one region which has an elastic material. It is also possible for the electromechanical component 300 to be manufactured such that the proving structure 330 comprises at least one region made of titanium or aluminum or of titanium-aluminum or of aluminum-silicon-titanium.

In other words, it can be said that the plate 330 may consist of an electrically conductive material. It would also be feasible for the plate 330 to be manufactured from a metal such as titanium, aluminum or alloys thereof (e.g. titanium-aluminum, TiAl or AlSiTi). In this context it may also be mentioned that it may be helpful to produce the plate 330 from an amorphous metal (such as TiAl, for example).

These devices, i.e. the elastic regions and the materials mentioned in the paragraph above may be regarded such that the electromechanical component 300 may be produced such that the proving structure 330 comprises a deflection facilitation structure 332 which facilitates the deflection of the proving structure 330 and/or reduces the bending strength of the proving structure 330.

In this context, various important properties may be taken into account in the design. The electromechanical component 300 may be produced such that the deflection facilitation structure 332 is configured such that the proving structure 330 achieves a desired shielding effect on the field emanating from the first electrode 310, apart from a shielding effect on the useful field, and the deflection facilitation structure 332 may be configured to facilitate deflection of the proving structure 330 as compared to a proving structure 330 which does not comprise the deflection facilitation structure 332.

It may also be useful for the electromechanical component 300 to be designed such that the deflection facilitation structure 332 and/or parts of the deflection facilitation structure 332 are arranged within a region or within regions of the proving structure 330 wherein an electrical field strength is smaller by at least 50 percent than within a region of a maximum field strength that exists between the first electrode 310 and the proving structure 330.

In the inventive example of FIG. 3, a simplified electromechanical component 300, or a part thereof, which is used as a deflection cell, for example, is depicted in the upper region. For simplification purposes, the deflection electrode 310 as well as a possible opening within the substrate (aperture) has been dispensed with. In addition, the two sections A and B are drawn in. In the lower region of FIG. 3, the sectional views A and B of the corresponding sections are depicted. The sectional view A in FIG. 3 shows the deflection electrode 310, which is surrounded on both sides by the higher reference potential electrode (ground electrode) 320. The reference potential electrode (ground electrode) 320 has the crosstalk shield 330 installed thereon across the area of contact/attachment surface 325, which crosstalk shield 330 covers the deflection electrode 310 at a defined distance. In the sectional view B in FIG. 3, the setup is once again depicted to be comparable to that of FIG. 7. The reference potential electrode (ground electrode) 320 has the crosstalk shield 330 installed thereon on the area of contact 325, which crosstalk shield 330 covers the deflection electrode 310 at a defined distance.

If the crosstalk shield 330, which in the embodiment depicted is located on the reference potential electrode (ground electrode) 320, is mechanically stable enough, due to the shape, the mechanical suspension, the thickness, etc., that it cannot be deflected sufficiently or not at all by applying a voltage customary for operation, the mechanical stability in the crosstalk shield 330 may be reduced by means of slits, which may be regarded as the deflection facilitation structure 432.

Embodiment of FIG. 4

FIG. 4 shows a schematic top view and two schematic sectional views of an electromechanical component 400 in accordance with a fourth embodiment of the present invention. In the upper region, an individual electromechanical component 400, or a part thereof, which is used as a deflection cell, for example, is depicted in a top view. In the lower region, the corresponding sectional views along the A and B sections are depicted. In the embodiment, the mechanical stability of the proving structure 430, which may also be used as a crosstalk shield, may be reduced by two slits 432a, 432b, which may be regarded as a deflection facilitation structure 432.

Figure 4A:
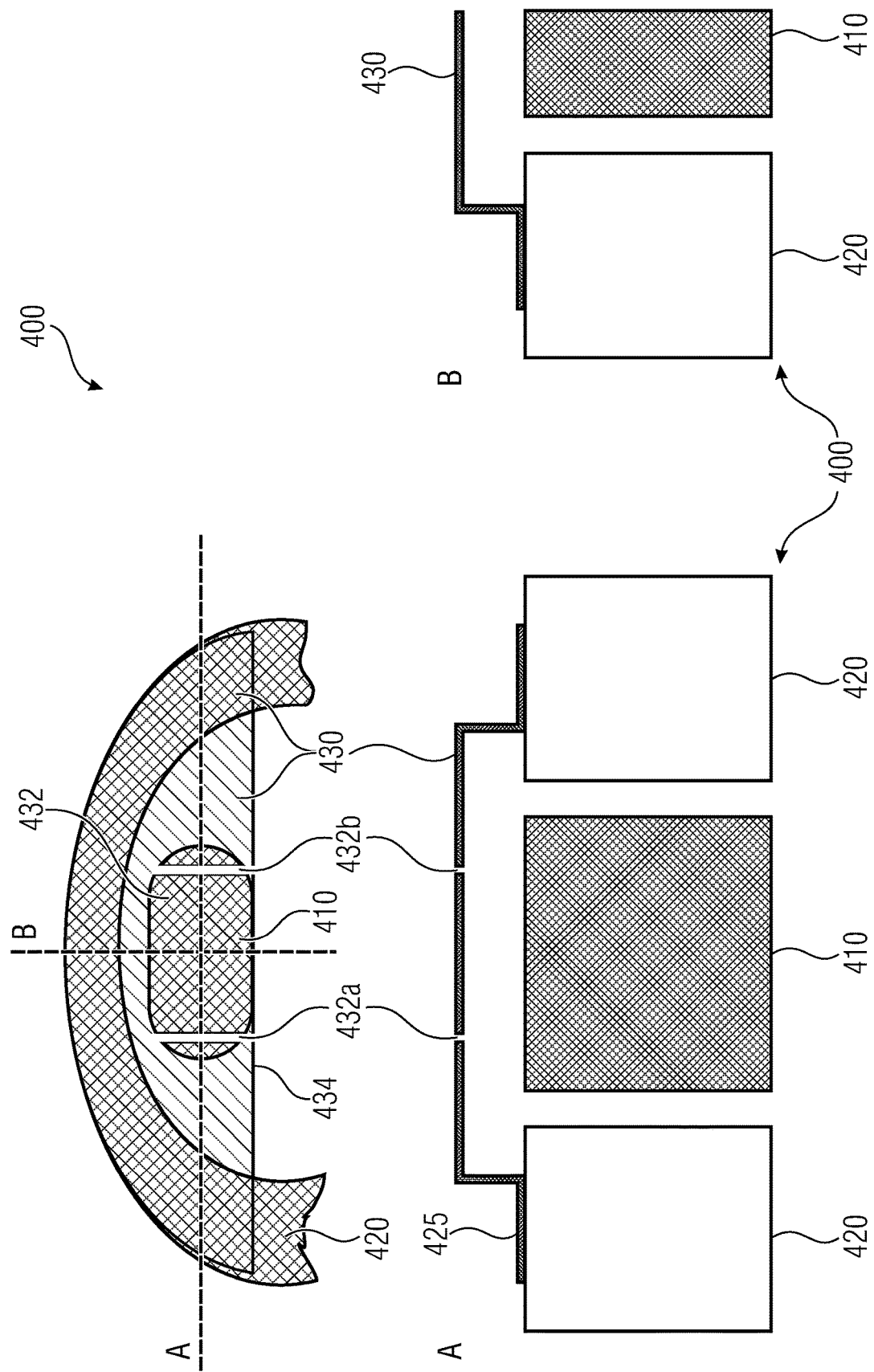
FIGS. 4a and 4b show two schematic top views and two schematic sectional views of an electromechanical component in accordance with a third embodiment of the present invention.
Figure 4B:
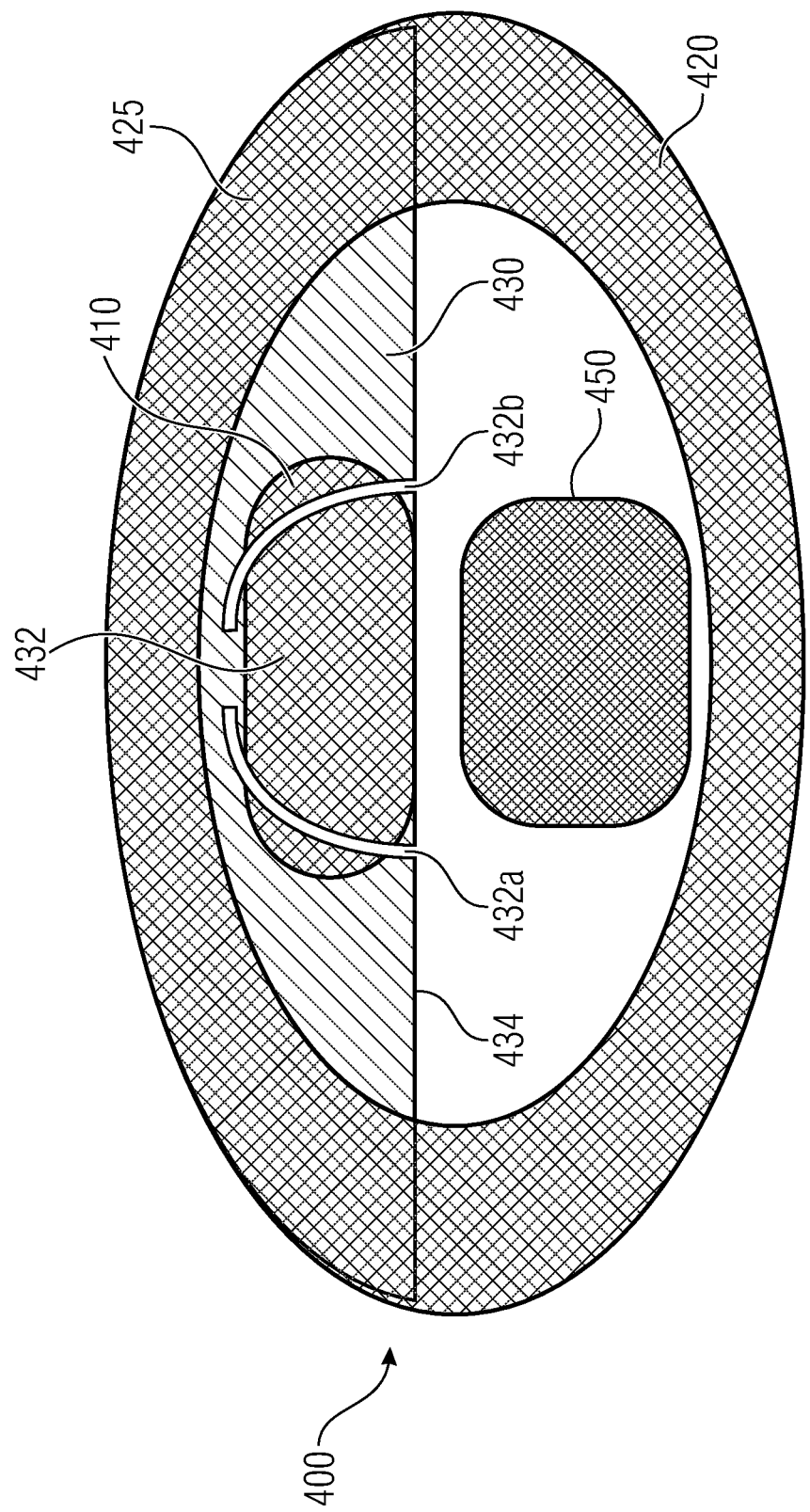

The representation in FIG. 4 orientates itself toward the selected representation in FIG. 3. In this context, the top view shows a possible manifestation of a second electrode 420, which in the embodiment also serves to attach the proving structure 430. In the embodiment of FIG. 4a, the second electrode 420 is depicted to be oval, or to be part of an oval structure, and this may improve a desired shielding effect caused by the second electrode 420. In FIG. 4b, the second electrode 420 is depicted such that the second electrode 420 encloses the arrangement consisting of the first electrode 410 and the opening 450 and thus also improves a desired shielding effect caused by the second electrode 420. Moreover, the top view depicts a joining surface 425 which may be regarded as a mechanical joining surface, possibly also a surface directed toward an electrical coupling, between the second electrode 420 and the proving structure 430. This joining surface 425 may also correspond to a base surface, in accordance with the base surface 131 in FIG. 1 and/or a base surface 231 in FIG. 2 and/or base surfaces of the proving structures of other embodiments; in this context, the proving structure 430 would correspond to a special case, e.g., of the proving structure 130, with an infinitesimal further surface 133. In addition, the top view depicts a deflection facilitation structure 432 which may facilitate deflection of the proving structure 430, for example as a result of an electrostatic force. The proving structure 430 further comprises a free end 434 spaced apart from the attachment surface 425.

The two bottom sectional views in FIG. 4 show sectional views of the electromechanical component 400, in correspondence with sections A and B. The sectional views each also depict the first electrode 410, which in the case of the embodiment is manufactured to be less high than the second electrode 420. As a result of this selection, it may be possible to produce the proving structure 430 as an essentially planar surface, i.e. with a deviation of less than 10% from a planar surface. This may result, e.g., in clearly simplified manufacturing of the proving structure 430, for example as compared to a proving structure 230 of FIG. 2, which comprises a base surface 231, a further surface 233 essentially perpendicular to the base surface, and an upper surface 235 essentially in parallel with the base surface.

FIG. 4 depicts a crosstalk shield 430 having two slits. As a result, the stability and, thus, deflection may become independent of the area of contact 425 of the plate 430 on both outer sides. In the example depicted here in FIG. 4, the area of contact 425 is mechanically decoupled on the right and on the left, for example from a movable part in the proving structure 430.

The electromechanical component 400 is manufactured such that the proving structure 430 comprises at least two slits 432a, 432b, and that the proving structure 430 comprises a free, i.e. non-attached, end 434. A first slit 432a extends, e.g., essentially in a straight manner, i.e. with a deviation of a maximum of 10 degrees from a mean direction, from the free end 434 of the proving structure 430 to an inner region of the proving structure 430.

A second slit 432b also extends, e.g., in an essentially straight manner, from the free end 434 of the proving structure 430 to an inner region of the proving structure 430.

The first slit 432a and the second slit 432b are provided at a mutual distance in the embodiment, so that, for example, the region between the first slit 432a and the second slit 432b may represent a flexible structure 432 which is surrounded on at least three sides by an attached region of the layer.

In other words, one may state that the slits 432a, 432b in the proving structure 430, also referred to as the plate, lead to such a design that the plate may be deflected further, given a low voltage (potential difference), than a plate which has no slits 432a, 432b yet is otherwise identical in design.

The differences that may be seen between FIG. 4a and FIG. 4b consist in that the slits 432a, 432b in FIG. 4a extend in an essentially straight manner, whereas the slits 432a, 432b in FIG. 4b exhibit the shape of an arc. The fundamental mode of operation and mode of action, however, are not influenced by this varying implementation.

Should this nevertheless result in no sufficient reduction in the mechanical stability, the plate may be constructed by arranging several slits, as depicted in FIG. 5.

Embodiment of FIG. 5

FIG. 5 shows a schematic top view and two schematic sectional views of an electromechanical component 500 in accordance with a fifth embodiment of the present invention. In the upper region, an individual electromechanical component 500, or a part thereof, which is used as a deflection cell, for example, is depicted in a top view. In the lower region, the corresponding sectional views along the A and B sections are depicted. The mechanical stability of the crosstalk shield, or the proving structure 530, may be reduced by arranging slits 532a, 532b, which may be regarded as a deflection facilitation structure 532.

Figure 5A:
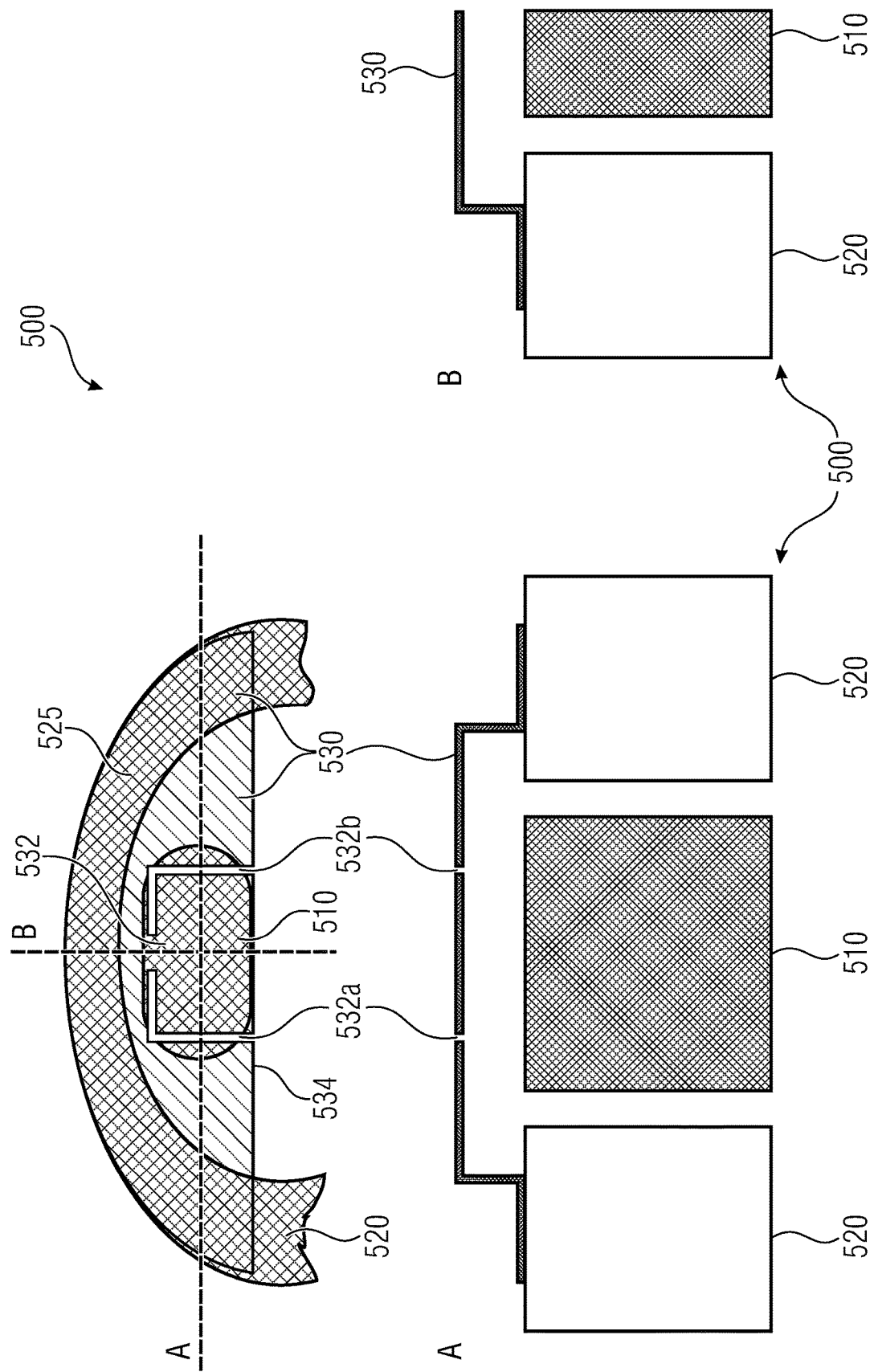
FIGS. 5a and 5b show two schematic top views and two schematic sectional views of an electromechanical component in accordance with a fifth embodiment of the present invention.
Figure 5B:
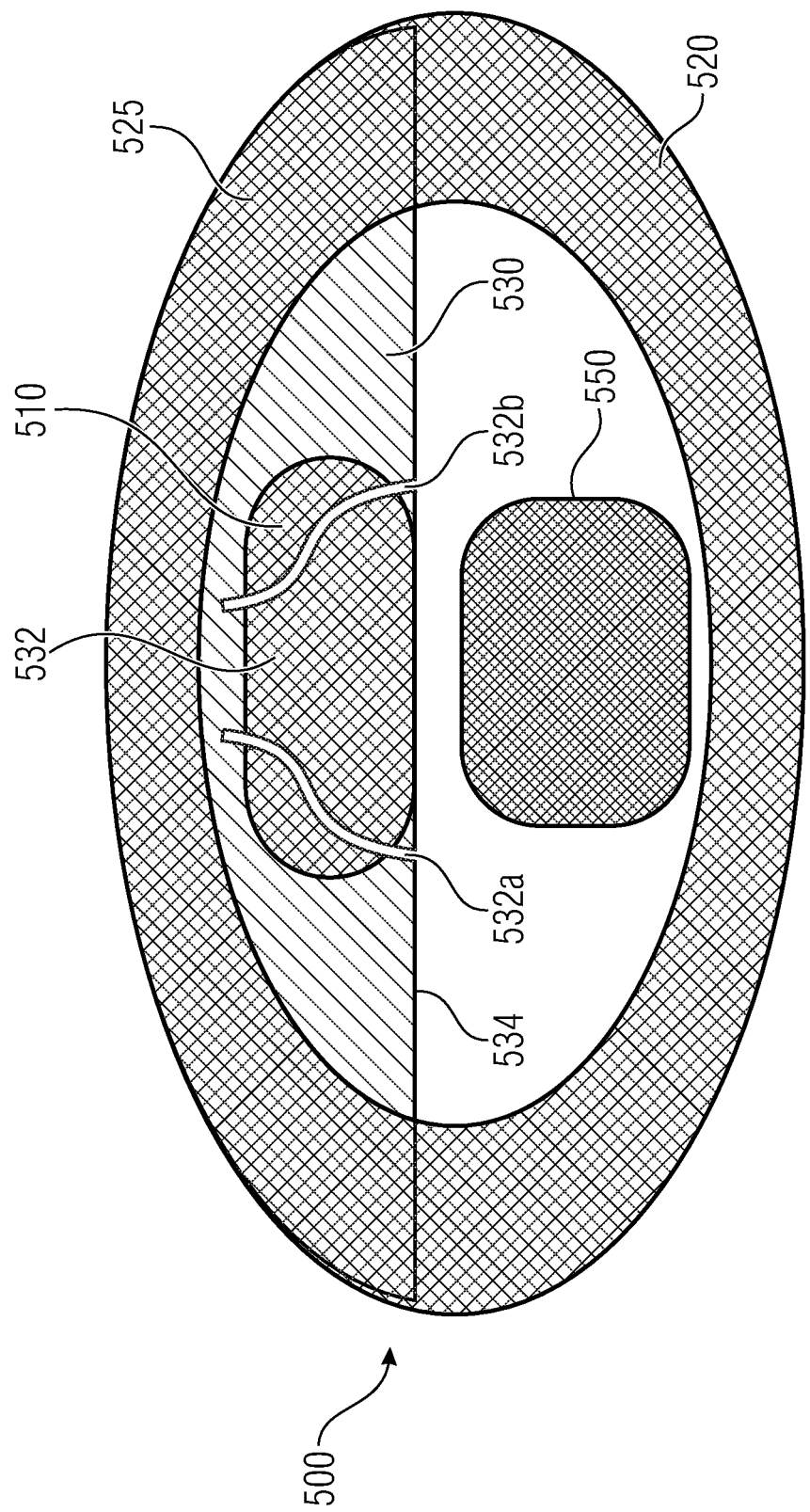

The representation in FIG. 5 orientates itself toward the selected representation in FIG. 3. In this context, the top view shows a possible manifestation of a second electrode 520, which also serves to attach the proving structure 530. In the embodiment of FIG. 5a, the second electrode 520 is depicted to be oval, or to be part of an oval structure, and this may improve a desired shielding effect caused by the second electrode 520. In FIG. 5b, the second electrode 520 is depicted such that the second electrode 520 encloses the arrangement consisting of the first electrode 510 and the opening 550 and thus also improves a desired shielding effect caused by the second electrode 520. Moreover, the top view depicts a joining surface 525 which may be regarded as a mechanical joining surface, possibly also a surface directed toward an electrical coupling, between the second electrode 520 and the proving structure 530. This joining surface 525 may also correspond to a base surface, in accordance with the base surface 131 in FIG. 1 and/or a base surface 231 in FIG. 2 and/or base surfaces of the proving structures of other embodiments; in this context, the proving structure 530 would correspond to a special case, e.g., of the proving structure 130, with an infinitesimal further surface 133. In addition, the top view depicts a deflection facilitation structure 532 which may facilitate deflection of the proving structure 530, for example as a result of an electrostatic force. The proving structure 530 further comprises a free end 534 spaced apart from the attachment surface 525.

The two bottom sectional views in FIG. 5 show sectional views of the electromechanical component 500, in correspondence with sections A and B. The sectional views each also depict the first electrode 510, which in the case of the embodiment is manufactured to be lower than the second electrode 520. As a result of this selection, it may be possible to produce the proving structure 530 as an essentially planar surface, i.e. with a deviation of less than 10% from a planar surface. This may result, e.g., in clearly simplified manufacturing of the proving structure 530, for example as compared to a proving structure 230 of FIG. 2, which comprises a base surface 231, a further surface 233 essentially perpendicular to the base surface, and an upper surface 235 essentially in parallel with the base surface.

The electromechanical component 500 is manufactured such that the proving structure 530 comprises at least two slits 532a, 532b, and that the proving structure 530 comprises a free end 534.

A first slit 532a extends, in a first portion of the first slit 532a, e.g. essentially in a straight manner, i.e. with a deviation of a maximum of 10 degrees from a mean direction, from the free end 534 of the proving structure 530 to an inner region of the proving structure 530. Following this, the first slit 532a here also extends, within the inner region of the proving structure 530, essentially in a straight manner, for example, in a second portion of the first slit 532a. In the embodiment, the first portion of the first slit 532a and the second portion of the first slit 532a form an angle of approximately 90 degrees. Other embodiments are also feasible, the angle being larger than 45 degrees, advantageously larger than 70 degrees.

A second slit 532b extends, in a first portion of the second slit 532b, for example essentially in a straight manner, from the free end 534 of the proving structure 530 to an inner region of the proving structure 530. Following this, the slit 532b extends, within the inner region of the proving structure 530, in a second portion of the second slit 532b, for example in an essentially straight manner. In the embodiment, the first portion of the second slit 532b and the second portion of the second slit 532b form an angle of approximately 90 degrees. Other embodiments are also feasible, the angle being larger than 45 degrees, advantageously larger than 70 degrees. Also, embodiments are feasible which orientate themselves by the representation in FIG. 5b, with the slits 532a, 532b each having the shape of an arc.

In addition, in the implementation described, the first slit 532a and the second slit 532b are provided at a mutual distance.

Moreover, the arrangement may also be seen such that the geometric design of the proving structure 530, or of the so-called plate, may also be predefined by slits 532a, 532b within the plate.

In the embodiment, the angles between both portions of the respective slits 532a, 532b are presented to have approximately 90 degrees. This does not represent a fundamental advantage over an angle having, e.g., 70 degrees. Rather, the mechanical stability of the proving structure 530 may be predefined by the minimum distance between the slits 532a, 532b.

For example, it would also be feasible to have a manifestation of the slits 532a, 532b wherein the slits extend toward each other in their respective first portions and extend away from each other in their respective second portions. This may represent a deflection facilitation structure which subdivides deflectable regions of the proving structure into different regions in a targeted manner.

The differences that may be seen between FIG. 5a and FIG. 5b consist in that the slits 532a, 532b in FIG. 5a extend in an essentially straight manner, whereas the slits 532a, 532b in FIG. 5b describe an arc. The fundamental mode of operation and mode of action, however, are not influenced by this varying implementation.

If the deflection facilitation structure in accordance with the embodiment described achieves no sufficient deflectability, an alternative arrangement of slits as shown in FIG. 6 would also be feasible. Here, a kind of rotary joint may be formed mechanically, which may enable easier deflection of the crosstalk shield.

Embodiment of FIG. 6

FIG. 6 shows a schematic top view and two schematic sectional views of an electromechanical component 600 in accordance with a sixth embodiment of the present invention. In the upper region, an individual electromechanical component 600 which is used as a deflection cell, for example, is depicted in a top view. In the lower region, the corresponding sectional views along the A and B sections are depicted. The mechanical stability of the crosstalk shield, or the proving structure 630, may be reduced by arranging slits 632a, 632b, 632c, which may be regarded as a deflection facilitation structure 632.

Figure 6A:
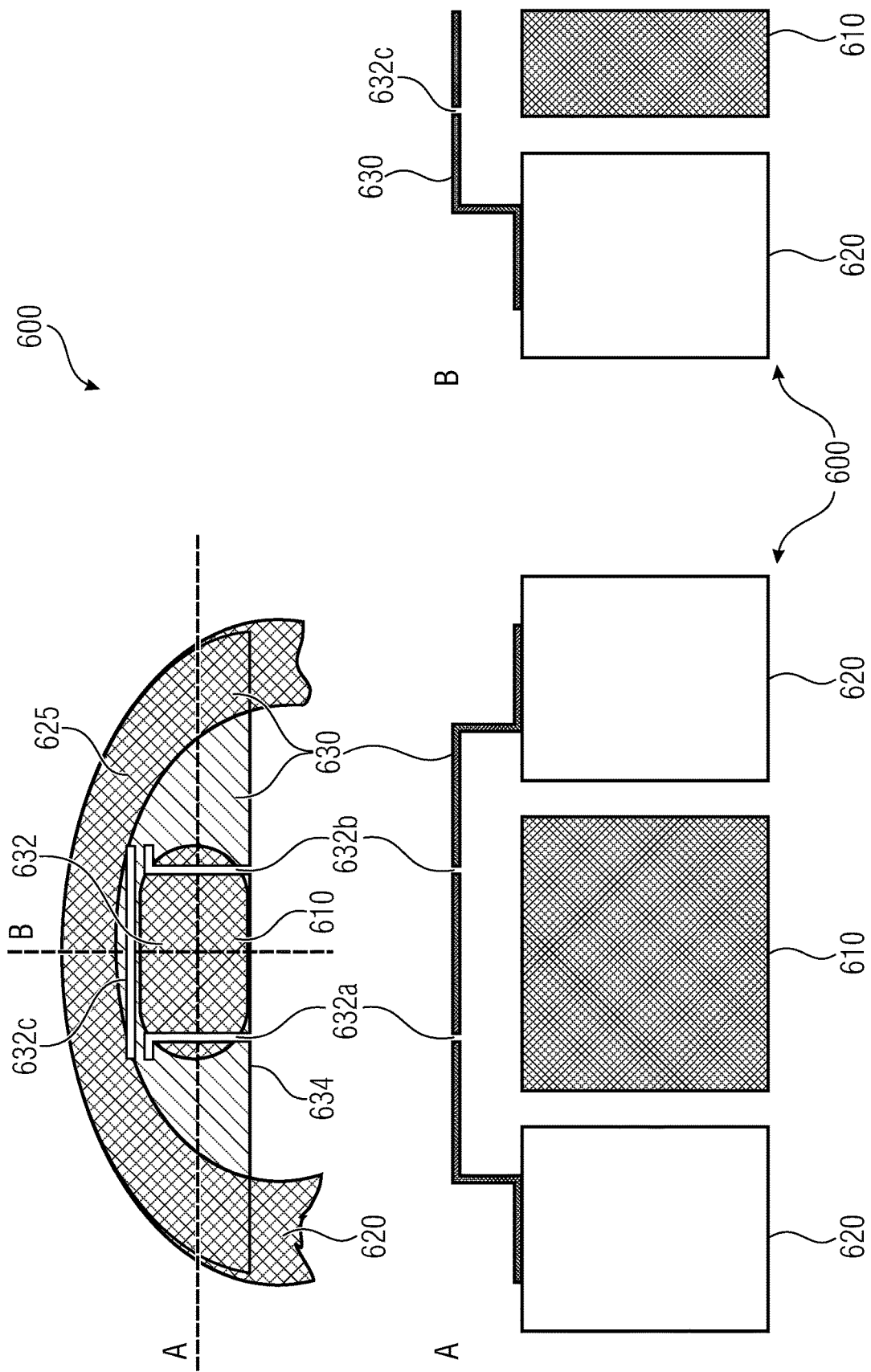
FIGS. 6a and 6b show two schematic top views and two schematic sectional views of an electromechanical component in accordance with a third embodiment of the present invention.
Figure 6B:
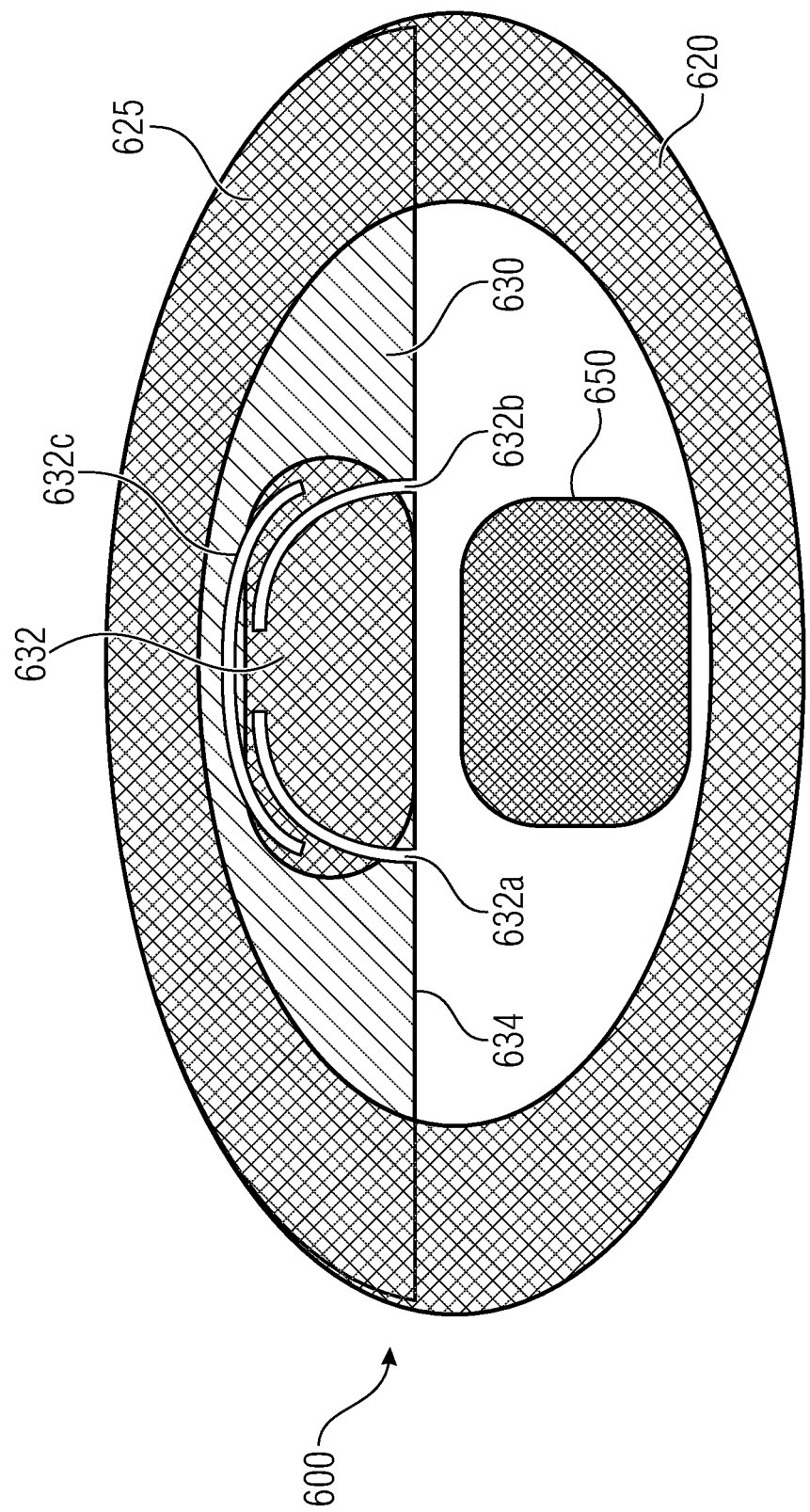

The representation in FIG. 6 orientates itself toward the selected representation in FIG. 3. In this context, the top view shows a possible manifestation of a second electrode 620, which also serves to attach the proving structure 630. In the embodiment of FIG. 6a, the second electrode 620 is depicted to be oval, or to be part of an oval structure, and this may improve a desired shielding effect caused by the second electrode 620. In FIG. 6b, the second electrode 620 is depicted such that the second electrode 620 encloses the arrangement consisting of the first electrode 610 and the opening 650 and thus also improves a desired shielding effect caused by the second electrode 620. Moreover, the top view depicts a joining surface 625 which may present a surface for mechanical connection, possibly also for electrical connection, between the second electrode 620 and the proving structure 630. This joining surface 625 may also be seen a base surface, in accordance with the base surface 131 in FIG. 1 and/or a base surface 231 in FIG. 2 and/or base surfaces of the proving structures of the other embodiments; thus, the planar proving structure 630 would represent a special case, e.g. of the proving structure 130 of FIG. 1. The planar surface may thus be seen by analogy with the proving structure 130, with an infinitesimal further surface 133. In addition, the top view depicts a deflection facilitation structure 632 which may facilitate deflection of the proving structure 630, for example as a result of an electrostatic force. The proving structure 630 further comprises a free end 634 spaced apart from the attachment surface 625.

The two bottom sectional views in FIG. 6 show the electromechanical component 600, in correspondence with sections A and B. The sectional views each also depict the first electrode 610, which in the case of the embodiment is manufactured to be less high than the second electrode 620. As a result of this selection, it may be possible to produce the proving structure 630 as an essentially planar surface, i.e. with a deviation of less than 10% from a planar surface. This may result, e.g., in clearly simplified manufacturing of the proving structure 630, for example as compared to a proving structure 230 of FIG. 2, which comprises a base surface 231, a further surface 233 essentially perpendicular to the base surface, and an upper surface 236 essentially in parallel with the base surface.

The electromechanical component 600 is manufactured such that the proving structure 630 comprises at least three slits 632a, 632b, 632c, and that the proving structure 630 further comprises a free end 634.

A first slit 632a extends, in a first portion of the first slit 632a, essentially in a straight manner from the free end 634 of the proving structure 630 to an inner region of the proving structure 630 and, following this, extends, within the inner region of the proving structure 630, essentially in a straight manner, for example, in a second portion of the first slit 632a. In this context, the first portion of the first slit 632a and the second portion of the first slit 632a form an angle of approximately 90 degrees. Other embodiments are also feasible, the angle being larger than 46 degrees, advantageously larger than 70 degrees. In the embodiment depicted, the direction of the angle is selected such that the second portion of the first slit 632a points toward the attachment surface 625, which is located more close by.

A second slit 632b extends, in a first portion of the second slit 632b, essentially in a straight manner, from the free end 634 of the proving structure 630 to the inner region of the proving structure 630 and, following this, extends, within the inner region of the proving structure 630, in a second portion of the second slit 632b, in an essentially straight manner. In this context, the first portion of the second slit 632b and the second portion of the second slit 632b form an angle of approximately 90 degrees. Other embodiments are also feasible, the angle being larger than 46 degrees, advantageously larger than 70 degrees. In the embodiment depicted, the direction of the angle is selected such that the second portion of the second slit 632b points toward the attachment surface 625, which is located more close by.

A third slit 632c extends within the inner region of the proving structure 630, the third slit 632c being adjacent to the second portion of the first slit 632a and to the second portion of the second slit 632b. In the embodiment depicted, the slit 632c is located between the respectively second portions of the slits 632a, 632b and the attachment surface 625.

The second portion of the first slit 632a extends, in a region adjacent to a first portion of the third slit 632c, essentially in parallel with the first portion of the third slit 632c. In a region adjacent to a second portion of the third slit 632c, the second portion of the second slit 632b extends essentially in parallel with the second portion of the third slit 632c. Essentially in parallel here means that the mean directions of the considered portions of the slits 632a, 632b, 632c may deviate from parallelism by up to 10 degrees.

Moreover, the first portion of the third slit 632c merges into the second portion of the third slit 632c. In the embodiment depicted, the third slit 632c is configured to be essentially straight. Thus, in the embodiment, no optical differentiation may be made between the first portion of the third slit 632c and the second portion of the third slit 632c.

Also, embodiments are feasible which orientate themselves by the representation in FIG. 6b, with the slits 632a, 632b, 632c each having the shape of an arc.

The differences that may be seen between FIG. 6a and FIG. 6b consist in that the slits 632a, 632b, 632c in FIG. 6a extend in an essentially straight manner, whereas the slits 632a, 632b, 632c in FIG. 6b describe an arc. The fundamental mode of operation and mode of action, however, are not influenced by this varying implementation.

Figure 7:
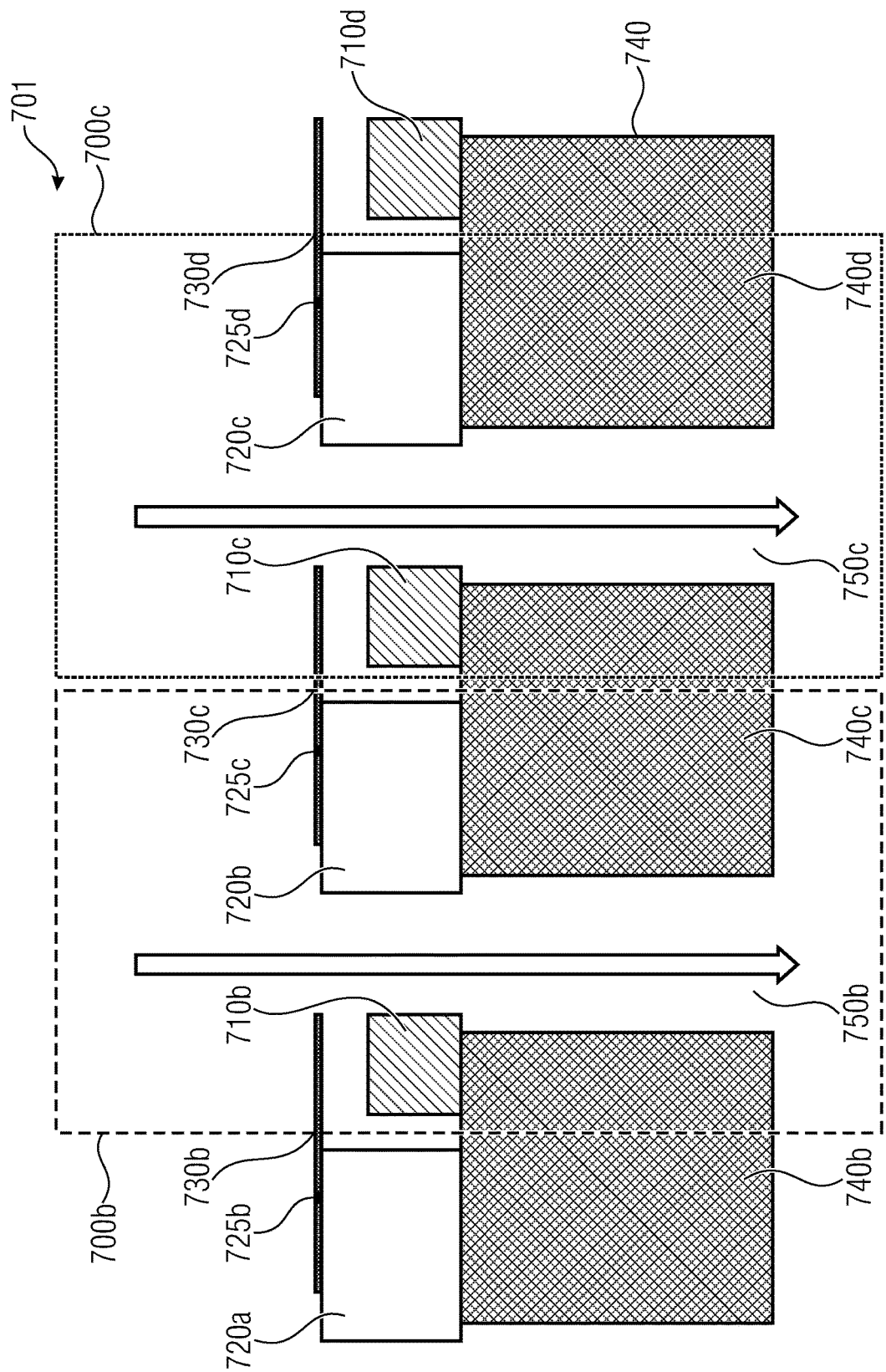
FIG. 7 shows a schematic sectional view of an electromechanical component in accordance with a seventh embodiment of the present invention.

Embodiment of FIG. 7

FIG. 7 shows a schematic sectional view of an electromechanical component arrangement 701 in accordance with a seventh embodiment of the present invention. What is shown here, in particular, is also the setup of the electrodes 710b, 710c, 710d, 720a, 720b, 720c, e.g. for deflecting electron beams. The proving structure 730b, 730c, 730d, which may also considered to be a crosstalk shield, is located on the higher ground electrode, i.e. the second electrode 720a, 720b, 720c. The second electrode 720a, 720b, 720c (ground electrode) is selected to be high enough so that the proving structure 730b, 730c, 730d (crosstalk shield) may have a sufficiently large distance from the deflection electrode 710b, 710c, 710d. In this context, the proving structure 730b, 730c, 730d may be configured to have a desired shielding effect on a field emanating from the first electrode 710b, 710c, 710d, apart from a shielding effect on the useful field.

The representation of the embodiment shown in FIG. 7 orientates itself by the depiction in FIG. 2. The embodiment comprises a plurality of first electrodes 710b, 710c, 710d, a plurality of second electrodes 720a, 720b, 720c, and a plurality of proving structures 730b, 730c, 730d.

FIG. 7 depicts a substrate 740 which in the representation of the sectional view is subdivided into three portions 740b, 740c, 740d by the existence of two openings 750b, 750c. A first electrode 710b, 710c, 710d and a second electrode 720a, 720b, 720c, respectively, are located on each of the three portions. A proving structure 730b, 730c, 730d is mounted on a respective second electrode 720a, 720b, 720c.

In FIG. 7, moreover, a first electromechanical component 700b is depicted by a dashed line, and a second electromechanical component 700c is depicted by a dotted line.

Association of the elements with the electromechanical component 700b may be specified as follows: the proving structure 730b is mechanically provided on a second electrode 720a, the second electrode 720a not belonging to the electromechanical component 700b but to an electromechanical component which may adjoin toward the left. Nevertheless, the proving structure 730b may be electrically coupled to the second electrode 720a, which in turn may be coupled to a reference potential supply. The proving structure 730b is associated with the first electrode 710b located between the substrate 740b and the proving structure 730b. A useful effect may emanate from a useful electrical field which may form between the first electrode 710b and the second electrode 720, which is adjacent toward the right and is located on the other side of the opening 750b, due to a potential difference existing between the two electrodes 710b, 720b.

An opening 750b arranged between the two electrodes 710b, 720b is depicted as a constituent part of the electromechanical component 700b. A particle beam may exit through said opening 750b and, thus, also through the substrate 740, which particle beam may be influenced by the useful electrical field.

In the embodiment, the second electrode 720a may have a shielding effect on an undesired part of the electrical field of the first electrode 710b so as to reduce crosstalk. The proving structure 730b may also have a comparable effect and reduce crosstalk of the electrical field of the first electrode 710*b*. In the embodiment, the second electrode 720*b* is used for mechanically attaching a further proving structure 730*c* associated with an electromechanical component 700*c*.

Association of the elements with the electromechanical component 700*c* may be specified as follows: the proving structure 730*c* is mechanically provided on a second electrode 720*b*, the second electrode 720*b* not belonging to the electromechanical component 700*c* but to an electromechanical component 700*b* which follows/joins toward the left. Nevertheless, the proving structure 730*c* may be electrically coupled to the second electrode 720*b*, which in turn may be coupled to a reference potential supply. The proving structure 730*c* is associated with the first electrode 710*c* located between the substrate 740*c* and the proving structure 730*c*. A useful effect may emanate from a useful electrical field which may form between the first electrode 710*c* and the second electrode 720*c*, which is adjacent toward the right and is located on the other side of the opening 750*c*, due to a potential difference existing between the two electrodes 710*c*, 720*c*.

FIG. 7 further depicts an opening 750*c* arranged between both electrodes 710*c*, 720*c*. A particle beam may exit through said opening 750*c* and, thus, also through the substrate 740, which particle beam may be influenced by the useful electrical field.

In the embodiment, the second electrode 720*b* may have a shielding effect on an undesired part of the electrical field of the first electrode 710*c* so as to reduce crosstalk. The proving structure 730*c* may also have a comparable effect and reduce crosstalk of the electrical field of the first electrode 710*c*, e.g. to the electromechanical component 700*b*. In the embodiment, the second electrode 720*c* is used for mechanically attaching a further proving structure 730*d* which may be associated, e.g., with an electromechanical component 700*d*, not depicted, and the first electrode 710*d*.

FIG. 7 depicts a substrate 740 which is subdivided into three portions 740*b*, 740*c*, 740*d* by the existence of two openings 750*b*, 750*c*. A first electrode 710*b*, 710*c*, 710*d* and a second electrode 720*a*, 720*b*, 720*c* are located on each of the three portions. A proving structure 730*b*, 730*c*, 730*d* is mounted on the second electrode 720*a*, 720*b*, 720*c*. According to this, the electromechanical component arrangement 701 comprises a plurality of first electrodes 710*b*, 710*c*, 710*d*, a plurality of second electrodes 720*a*, 720*b*, 720*c*, and a plurality of proving structures 730*b*, 730*c*, 730*d*, a respective proving structure 730*b*, 730*c*, 730*d* being configured as an essentially planar surface. In this context, it may be useful to configure the second electrode 720*a*, 720*b*, 720*c* to be higher than the first electrode 710*b*, 710*c*, 710*d* so as to ensure a sufficiently large distance between the proving structure 730*b*, 730*c*, 730*d* and the first electrode 710*b*, 710*c*, 710*d*.

In addition, the electromechanical component 700*b*, 700*c* may be described such that the first electrodes 710*b*, 710*c*, 710*d* are arranged on a substrate 740. The proving structures 730*b*, 730*c*, 730*d* each overlap a respective first electrode 710*b*, 710*c*, 710*d* such that a respective first electrode 710*b*, 710*c*, 710*d* is located at least partly between a respective proving structure 730*b*, 730*c*, 730*d* and the substrate 740, or a respective substrate portion 740*b*, 740*c*, 740*d*. This may be effected in order to have a desired shielding effect on the field emanating from a respective first electrode 710*b*, 710*c*, 710*d*, apart from a shielding effect on the useful field.

Because of the sectional representation, it is not directly apparent that a respective proving structure 730*b*, 730*c*, 730*d* may comprise several portions located opposite several lateral surfaces of a respective first electrode 710*b*, 710*c*, 710*d* so as to shield the electrode 710*b*, 710*c*, 710*d* off toward several directions.

However, what can be seen is that the electromechanical components 700*b*, 700*c* are manufactured such that the first electrode 710*b*, 710*c*, 710*d* and the second electrode 720*a*, 720*b*, 720*c* are raised in relation to a main surface of a substrate 740. What is meant by main surface is a central surface of a substrate 740.

In the example one can see that the electromechanical components 700*b*, 700*c* are manufactured such that a respective second electrode 720*a*, 720*b*, 720*c* is higher, in relation to main surface of the substrate 740, than a respective first electrode 710*b*, 710*c*, 710*d*. In this manner, it may be possible for a respective proving structure 730*b*, 730*c*, 730*d* to be manufactured as an approximately planar surface that it easy to process. FIG. 8 depicts a different implementation of the proving structures 830*b*, 830*c*, 830*d*, which is also possible. In this context, the proving structure comprises a base surface, a further surface perpendicular to the base surface, and an upper surface essentially in parallel with the base surface. Both implementations may have advantages over the respectively other one. Further, not mentioned implementations of the proving structure are also feasible and shall therefore not be excluded.

To form a useful electrical field, which may form due to a potential difference between both first electrodes 710*b*, 710*c* and the associated second electrodes 720*b*, 720*c*, it may be useful for the first electrodes 710*b*, 710*c* and the second electrodes 720*b*, 720*c* to be located opposite one another, or both electrodes may also be located opposite each other within a predefined region.

In this context, it is also possible for a respective first electrode 710*b*, 710*c* and a respective second electrode 720*b*, 720*c* to be configured such that the useful field is suitable to influence at least a mechanical structure, said mechanical structure differing from the proving structure 730*b*, 730*c*, 730*d*. This embodiment, too, is also not directly apparent in FIG. 7 but may be explained well by means of said figure. The mounting location of the other mechanical structure may usefully be selected to be located within a region of as high a field strength as possible. For example, said region may be a region located between a respective first electrode 710*b*, 710*c* and a respective second electrode 720*b*, 720*c*. It would also be feasible, accordingly, for one or more electrodes 710*b*, 710*c*, 720*b*, 720*c* to be used so as to mechanically influence small mechanical structures such as MEMS structures (micro-electromechanical systems structures). What is not mentioned in the portion are the electrodes 720*a* and 710*d* since in the presentation selected, the respective complementary electrode, i.e. a possible electrode 710*a* and 720*d*, is not depicted. In principle, they may be present, and the electromechanical component arrangement 701 may comprise further electromechanical components.

The electromechanical components 700*b*, 700*c* depicted may also be manufactured such that the first electrode 710*b*, 710*c* and the second electrode 720*b*, 720*c* are configured such that the useful field is suited to influence electromagnetic radiation and/or individual photons. This may be directly possible or may be possible via a "mediating" structure inserted, e.g., into the electrical field that may be present between the first electrode 710*b*, 710*c* and the second electrode 720*b*, 720*c*. What is also feasible, therefore, is utilization of an electro-optical structure, for example, whose refractive index may change as a result of an electrical field. This may open up a further range of possibilities. Of course, the influence on electromagnetic radiation is not restricted to the example mentioned. Rather, a multitude of different possibilities may be opened up by influencing even photons by utilizing the electromechanical components 700*b*, 700*c*, or their useful fields. In other words, the electrodes may be used for influencing electromagnetic radiation or even individual photons.

Figure 8:
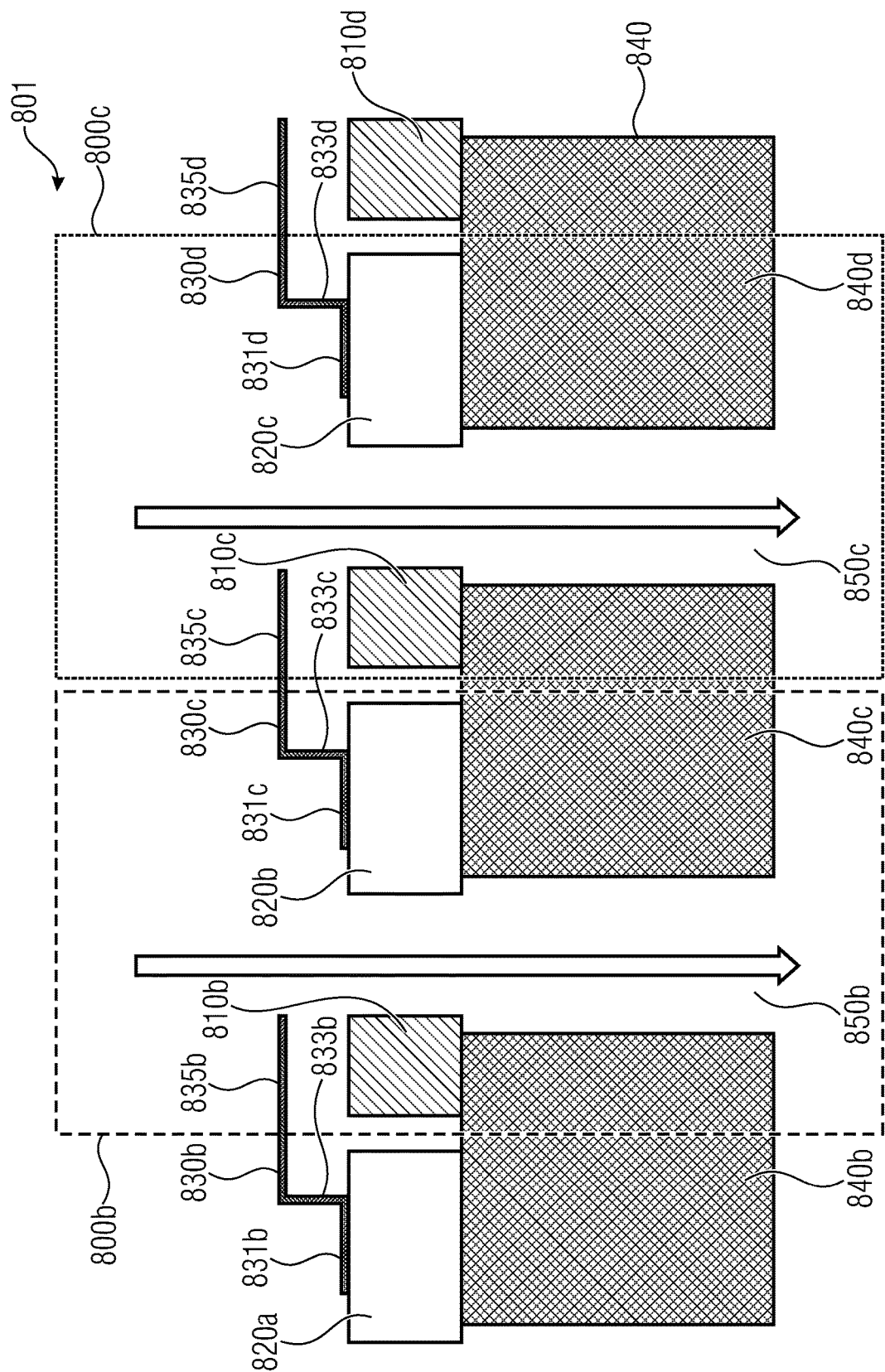
FIG. 8 shows a schematic sectional view of an electromechanical component in accordance with an eighth embodiment of the present invention.

A setup similar to that depicted in FIG. 7 is shown in the inventive example of FIG. 8. The difference of both setups consists in that in FIG. 7, the reference potential electrode (ground electrode) 720*a*, 720*b*, 720*c* is set up to be higher than the deflection electrode 710*b*, 710*c*, 710*d*, so that the crosstalk shield 730*b*, 730*c*, 730*d* may be mounted as a flat, planar plate on the reference potential electrode (ground electrode) 720*a*, 720*b*, 720*c* without touching the deflection electrode 710*b*, 710*c*, 710*d* as a result of the deflection.

Embodiment of FIG. 8

FIG. 8 shows a schematic sectional view of an electromechanical component arrangement 801 in accordance with an eighth embodiment of the present invention. What is shown here, in particular, is also the setup of the electrodes 810, 820, e.g. for deflecting electron beams. The proving structure 830, which may also perform the function of a crosstalk shield and may be designed to have a sufficiently large distance from the deflection electrode 810, is located on the second electrode 820, which, depending on its utilization, may also be referred to as a ground electrode.

The representation of the embodiment shown in FIG. 8 orientates itself by the representation in FIG. 2.

The embodiment comprises a plurality of first electrodes 810*b*, 810*c*, 810*d*, a plurality of second electrodes 820*a*, 820*b*, 820*c*, and a plurality of proving structures 830*b*, 830*c*, 830*d*. A respective proving structure 830*b*, 830*c*, 830*d* comprises a base surface 831*b*, 831*c*, 831*d*, a further surface 833*b*, 833*c*, 833*d*, which is essentially perpendicular to the base surface 831*b*, 831*c*, 831*d*, and an upper surface 835*b*, 835*c*, 835*d*, which is essentially in parallel with the base surface 831*b*, 831*c*, 831*d*.

FIG. 8 depicts a substrate 840 which in the representation of the sectional view is subdivided into three portions 840*b*, 840*c*, 840*d* by the existence of two openings 850*b*, 850*c*. A first electrode 810*b*, 810*c*, 810*d* and a second electrode 820*a*, 820*b*, 820*c*, respectively, are located on each of the three portions. A respective second electrode 820*a*, 820*b*, 820*c* has a proving structure 830*b*, 830*c*, 830*d* mounted thereon which in turn comprises a base surface 831*b*, 831*c*, 831*d*, a further surface 833*b*, 833*c*, 833*d*, and an upper surface 835*b*, 835*c*, 835*d*.

In FIG. 8, moreover, a first electromechanical component 800*b* is depicted by a dashed line, and a second electromechanical component 800*c* is depicted by a dotted line.

Association of the elements with the electromechanical component 800*b* may be specified as follows: the proving structure 830*b* is mechanically provided on a second electrode 820*a*, the second electrode 820*a* not belonging to the electromechanical component 800*b* but to an electromechanical component which may adjoin toward the left. Nevertheless, the proving structure 830*b* may be electrically coupled to the second electrode 820*a*, which in turn may be coupled to a reference potential supply. The proving structure 830*b* is associated with the first electrode 810*b* located between the substrate 840*b* and the upper surface 835*b* of the proving structure 830*b*. A useful effect may emanate from a useful electrical field which may form between the first electrode 810*b* and the second electrode 820*b*, which is adjacent toward the right and is located on the other side of the opening 850*b*, due to a potential difference existing between the two electrodes 810*b*, 820*b*.

FIG. 8 further depicts an opening 850*b* arranged between both electrodes 810*b*, 820*b*. A particle beam may exit through said opening 850*b* and, thus, also through the substrate 840, which particle beam may be influenced by the useful electrical field.

In the embodiment, the second electrode 820*a* may have a shielding effect on an undesired part of the electrical field of the first electrode 810*b* so as to reduce crosstalk. The proving structure 830*b* may also have a comparable effect and reduce crosstalk of the electrical field of the first electrode 810*b*. In the embodiment, the second electrode 820*b* is used for mechanically attaching a further proving structure 830*c* which is associated with an electromechanical component 800*c*.

Association of the elements with the electromechanical component 800*c* may be specified as follows: the proving structure 830*c* is mechanically provided on a second electrode 820*b*, the second electrode 820*b* not belonging to the electromechanical component 800*c* but to an electromechanical component 800*b* which adjoins toward the left. Nevertheless, the proving structure 830*c* may be electrically coupled to the second electrode 820*b*, which in turn may be coupled to a reference potential supply. The proving structure 830*c* is associated with the first electrode 810*c* located between the substrate 840*c* and the upper surface 835*c* of the proving structure 830*c*. A useful effect may emanate from a useful electrical field which may form between the first electrode 810*c* and the second electrode 820*c*, which is adjacent toward the right and is located on the other side of the opening 850*c*, due to a potential difference existing between the two electrodes 810*c*, 820*c*.

FIG. 8 further depicts an opening 850*c* arranged between both electrodes 810*c*, 820*c*. A particle beam may exit through said opening 850*c* and, thus, also through the substrate 840, which particle beam may be influenced by the useful electrical field.

In the embodiment, the second electrode 820*b* may have a shielding effect on an undesired part of the electrical field of the first electrode 810*c* so as to reduce crosstalk. The proving structure 830*c* may also have a comparable effect and reduce crosstalk of the electrical field of the first electrode 810*c*, e.g. to the electromechanical component 800*b*. In the embodiment, the second electrode 820*c* is used for mechanically attaching a further proving structure 830*d* which may be associated, e.g., with an electromechanical component 800*d*, not depicted here, and the first electrode 810*d*.

In summary, it may be said that FIG. 8 depicts a substrate 840 which is subdivided into three portions 840*b*, 840*c*, 840*d* by the existence of two openings 850*b*, 850*c*. A first electrode 810*b*, 810*c*, 810*d* and a second electrode 820*a*, 820*b*, 820*c*, respectively, are located on each of the three portions. A proving structure 830*b*, 830*c*, 830*d* is mounted on the second electrode 820*a*, 820*b*, 820*c*. According to this, the electromechanical component arrangement 801 comprises a plurality of first electrodes 810*b*, 810*c*, 810*d*, a plurality of second electrodes 820*a*, 820*b*, 820*c*, and a plurality of proving structures 830*b*, 830*c*, 830*d*, a respective proving structure 830*b*, 830*c*, 830*d* comprising a base surface 831*b*, 831*c*, 831*d*, a further surface 833*b*, 833*c*, 833*d*, which is essentially perpendicular to the base surface 831*b*, 831*c*, 831*d*, and an upper surface 835*b*, 835*c*, 835*d*, which is essentially in parallel with the base surface 831*b*, 831*c*, 831*d*. In the embodiment, the first electrode 810*b*, 810*c*, 810*d* and the second electrode 820*a*, 820*b*, 820*c* are depicted to have essentially equally heights. This may exclude utilization of a proving structure, which essentially consists of a planar surface, similarly to a proving structure 730b, 730c, 730d.

The electromechanical components 800b, 800c may be manufactured such that a respective first electrode 810b, 810c and a respective second electrode 820b, 820c are configured such that the useful field is suited to influence a particle beam, e.g. of charged particles. This may also be reflected in a deflection of the particle beam.

Thus, the setup may be understood to mean an electromechanical component 800b, 800c, wherein the first electrode 810b, 810c and the second electrode 820b, 820c are configured such that the useful field is suited to deflect a particle beam of charged particles. Thus, a deflection of the charged particle beam by a certain angle may be achieved with the present invention, which angle may depend, among others, on the strength of the electrical field and, thus, on the degree of the potential difference between the first electrode 810b, 810c and the second electrode 820b, 820c. For this reason, it is useful to be able to ascertain the functionality of the component as easily as possible. As was already mentioned, this may be achieved by means of the proving structure 830b, 830c. The proving structure 830b, 830c may also be used as a shielding device so as to reduce crosstalk of the desired electrical field to other structures and/or electromechanical components. What has not been mentioned here are electrodes 820a and 810d since their complementary electrodes 810a and 820d are not depicted. However, this is not to exclude that said electrodes may be present and that, therefore, further electromechanical components 800a and 800d may be present and, thus, may be subject to the same phenomena.

In addition, the electromechanical component 800b, 800c may also be described to the effect that the electromechanical component 800b, 800c comprises a substrate 840. The latter may be used for allowing the first electrode 810b, 810c, 810d and the second electrode 820a, 820b, 820c to be located opposite each other at a distance. The substrate 840 may comprise an opening 850b, 850c, e.g. within a region located between the first electrode 810b, 810c and the second electrode 820b, 820c.

The opening 850b, 850c may be configured to allow passage of a particle beam through the electromechanical component 800b, 800c. This opening may also be referred to as an aperture; basically, the aperture and the opening 850b, 850c may perform the same task. Thus, an opening 850b, 850c (aperture) may be located between the electrodes 810b, 810c, 820b, 820c within a predefined region, said opening representing a passage through a respective electromechanical component 800b, 800c.

For logical reasons, in this case, too, a respective first electrode 810b, 810c and a respective second electrode 820b, 820c may be configured such that the useful electrical field is suited to influence or deflect a particle beam.

The opening 850b, 850c may be manufactured such that it may enable, e.g., passage of an electron beam through the entire component and/or through the substrate 840, which may also mean that the electron beam exits on the rear side, or bottom side, of the electromechanical component 800b, 800c and may continue its path in an almost uninfluenced manner.

In the embodiment, the height of the first electrode 810b, 810c, 810d and of the second electrode 820a, 820b, 820c is approximately identical. For this reason, it may be useful to manufacture the proving structure 830b, 830c, 830d in the implementation selected, i.e. with a base surface 831b, 831c, 831d, a further surface 833b, 833c, 833d and an upper surface 835b, 835c, 835d. The proving structure 830b, 830c, 830d depicted may have a high level of deflectability due to its setup.

In this embodiment, the problem of the crosstalk effect may also occur. What is problematic about the electromechanical component is that when applying a potential difference (voltage) to an electrode, the electrical field may crosstalk to neighboring cells, for example from the electromechanical component 800c to the electromechanical component 800b. A so-called crosstalk effect occurs. Consequently, electron beams may be influenced in their trajectories, for example, which are not to be influenced. In this context, the proving structures, in the example mentioned the proving structure 830c, which may also be referred to as crosstalk shields, may reduce crosstalk.

In other words, the setup may be described to the effect that a respective proving structure 830b, 830c, 830d, i.e. the plate, may be located above a respective first electrode 810b, 810c, 810d at a defined distance and may just about fully cover said first electrode. Thus, the proving structure 830b, 830c, 830d, i.e. the plate, which may be conductively connected to an electrode, e.g. a respective second electrode 820a, 820b, 820c, may be used as a crosstalk shield at the same time.

In the inventive example of FIG. 8, a sectional view of a possible setup is thus depicted. In the individual deflection cell, an electron beam is shown which flies through an aperture 850b, 850c through the bulk silicon 840 of the chip. The deflection electrode 810b, 810c is set up on the substrate 840 (chip) on one side of the aperture 850b, 850c. On the other side of the aperture 850b, 850c, opposite the deflection electrode 810b, 810c, the reference potential electrode (ground electrode) 820b, 820c is located. As depicted here, a respective deflection electrode 810b, 810c, 810d and a respective reference potential electrode (ground electrode) 820a, 820b, 820c are set up to be equal in height. The crosstalk shield 830b, 830c, 830d is mounted on the reference potential electrode (ground electrode) 820a, 820b, 820c by the anchorage and may also be conductively connected to the reference potential electrode (ground electrode) 820a, 820b, 820c. The crosstalk shield 830b, 830c, 830d is shaped and set up to have a defined distance from the deflection electrode 810b, 810c, 810d so that enough space may be available for the deflection and so that no short circuit can occur, as a result of the deflection, between the crosstalk shield 830b, 830c, 830d and the deflection electrode 810b, 810c, 810d.

The electromechanical components 800b, 800c (the deflection cells) may be arranged on the surface of a substrate 840 (chip) in any number and in both spatial directions (X & Y).

Figure 9:
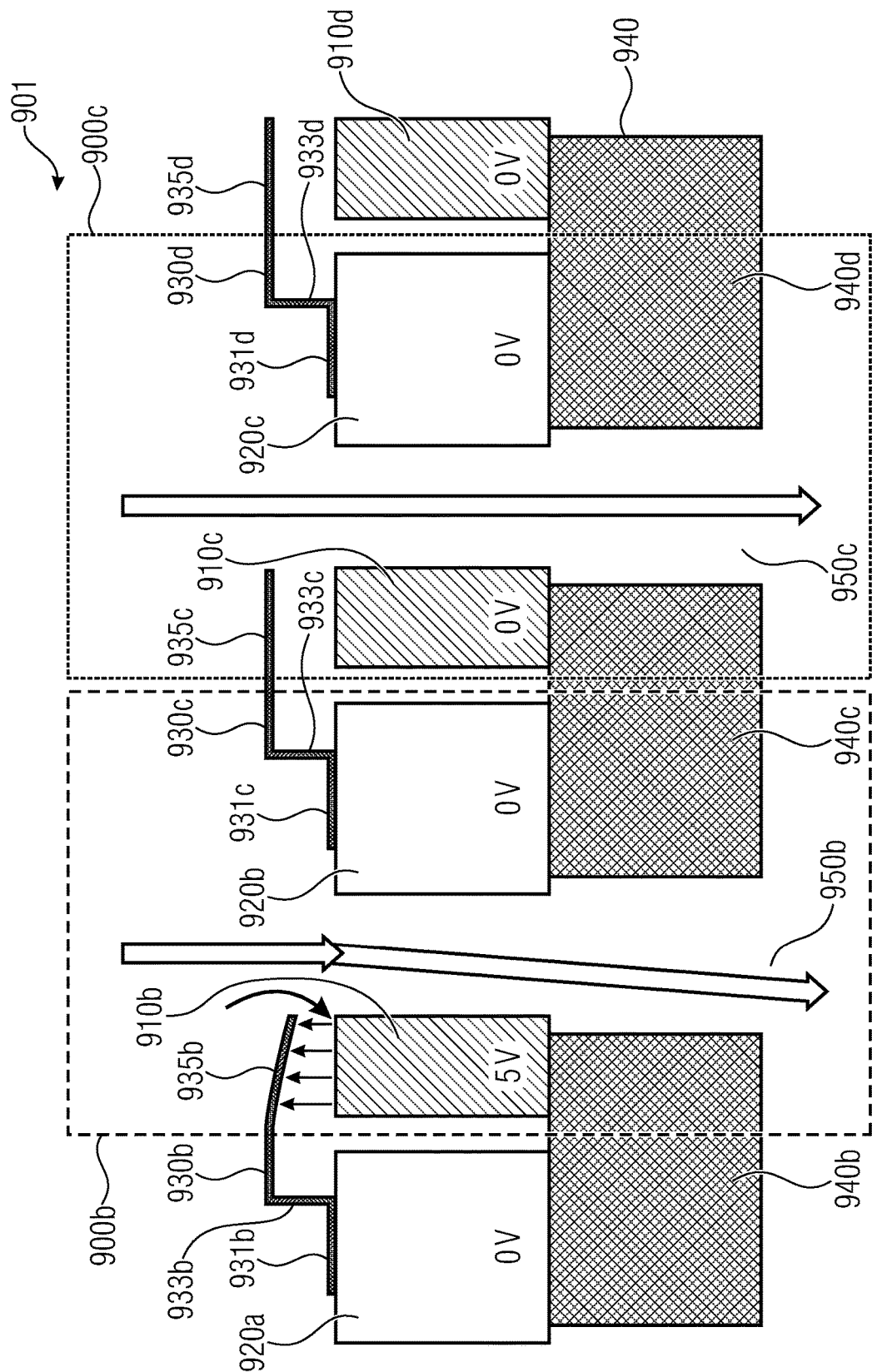
FIG. 9 shows a schematic sectional view of an electromechanical component in accordance with a ninth embodiment of the present invention.

Embodiment of FIG. 9

FIG. 9 shows a schematic sectional view of an electromechanical component arrangement 901 in accordance with a ninth embodiment of the present invention. What is shown here, in particular, is also the setup, or arrangement, of the electrodes 910, 920, e.g. for deflecting electron beams. The case depicted here may in turn be seen as a feasible utilization of the invention. The left-hand deflection electrode, i.e. the first electrode 910b, is controlled, this is characterized by "5 V" on the electrode. In this manner, the electron beam characterized by the fat arrow may be deflected. At the same time, the proving structure 930b, which may also be referred to as a crosstalk shield, may be deflected above the electrode 910b.

The representation of the embodiment shown in FIG. 9 orientates itself by the representation in FIG. 2. The embodiment comprises a plurality of first electrodes 910b, 910c, 910d, a plurality of second electrodes 920a, 920b, 920c, and a plurality of proving structures 930b, 930c, 930d. A respective proving structure 930b, 930c, 930d comprises a base surface 931b, 931c, 931d, a further surface 933b, 933c, 933d, which is essentially perpendicular to the base surface 931b, 931c, 931d, and an upper surface 935b, 935c, 935d, which is essentially in parallel with the base surface 931b, 931c, 931d.

FIG. 9 depicts a substrate 940 which in the representation of the sectional view is subdivided into three portions 940b, 940c, 940d by the existence of two openings 950b, 950c. A first electrode 910b, 910c, 910d and a second electrode 920a, 920b, 920c, respectively, are located on each of the three portions. A respective second electrode 920a, 920b, 920c has a proving structure 930b, 930c, 930d mounted thereon which in turn comprises a base surface 931b, 931c, 931d, a further surface 933b, 933c, 933d, and an upper surface 935b, 935c, 935d.

In FIG. 9, moreover, a first electromechanical component 900b is depicted by a dashed line, and a second electromechanical component 900c is depicted by a dotted line.

Association of the elements with the electromechanical component 900b may be specified as follows: the proving structure 930b is mechanically provided on a second electrode 920a, the second electrode 920a not belonging to the electromechanical component 900b but to an electromechanical component which may adjoin toward the left. Nevertheless, the proving structure 930b may be electrically coupled to the second electrode 920a, which in turn may be coupled to a reference potential supply. The proving structure 930b is associated with the first electrode 910b located between the substrate 940b and the upper surface 935b of the proving structure 930b. A useful effect may emanate from a useful electrical field which may form between the first electrode 910b, which is inscribed by 5 V, and the second electrode 920b, which is inscribed by 0 V, is adjacent toward the right and is located on the other side of the opening 950b, due to a potential difference existing between the two electrodes 910b, 920b.

FIG. 9 further depicts an opening 950b arranged between both electrodes 910b, 920b. A particle beam may exit through said opening 950b and, thus, also through the substrate 940, which particle beam may be influenced by the useful electrical field.

In the embodiment, the second electrode 920a may have a shielding effect on an undesired part of the electrical field of the first electrode 910b so as to reduce crosstalk. The proving structure 930b may also have a comparable effect and reduce crosstalk of the electrical field of the first electrode 910b. In the embodiment, the second electrode 920b is used for mechanically attaching a further proving structure 930c which is associated with an electromechanical component 900c.

Association of the elements with the electromechanical component 900c may be specified as follows: the proving structure 930c is mechanically provided on a second electrode 920b, the second electrode 920b not belonging to the electromechanical component 900c but to an electromechanical component 900b which adjoins toward the left. Nevertheless, the proving structure 930c may be electrically coupled to the second electrode 920b, which in turn may be coupled to a reference potential supply. The proving structure 930c is associated with the first electrode 910c located between the substrate 940c and the upper surface 935c of the proving structure 930c. A useful effect may emanate from a useful electrical field which may form between the first electrode 910c, which is inscribed by 0 V, and the second electrode 920c, which is also inscribed by 0 V, is adjacent toward the right and is located on the other side of the opening 950c, and due to a potential difference existing between the two electrodes 910c, 920c.

FIG. 9 further depicts an opening 950c arranged between both electrodes 910c, 920c. A particle beam may exit through said opening 950c and, thus, also through the substrate 940, which particle beam may be influenced by the useful electrical field.

In the embodiment, the second electrode 920b may have a shielding effect on an undesired part of the electrical field of the first electrode 910c so as to reduce crosstalk. The proving structure 930c may also have a comparable effect and reduce crosstalk of the electrical field of the first electrode 910c, e.g. to the electromechanical component 900b. In the embodiment, the second electrode 920c is used for mechanically attaching a further proving structure 930d which may be associated, e.g., with an electromechanical component 900d which is not depicted.

In this context, FIG. 9 depicts a substrate 940 which is subdivided into three portions 940b, 940c, 940d by the existence of two openings 950b, 950c. A first electrode 910b, 910c, 910d and a second electrode 920a, 920b, 920c, respectively, are located on each of the three portions. A respective second electrode 920a, 920b, 920c has a proving structure 930b, 930c, 930d mounted thereon which in turn comprises a base surface 931b, 931c, 931d, a further surface 933b, 933c, 933d, and an upper surface 935b, 935c, 935d.

In FIG. 9, a particle beam which is deflected as a result of the potential difference, or of the useful electrical field, is depicted in the left-hand "deflection cell" 900b formed of the first electrode 910b, inscribed by 5 V, and the second electrode 920b adjacent to the right. Moreover, deflection of the proving structure 930b, for example as compared to the other proving structures 930c, 930d, is indicated by an arrow. In addition, the electrical field causing the deflection is to be depicted by four arrows pointing from the first electrode 910b to the proving structure 930b. Said four arrows indicate an electrical field which forms between the first electrode 910b and the proving structure 930b. The right-hand "deflection cell" formed by the first electrode 910c and the second electrode 920c has no potential difference existing between the electrodes 910c, 920c. As a result, no deflection of the proving structure 930c and no deflection of the particle beam occurs.

In the embodiment, the two openings 950b, 950c are depicted which are arranged between the two electrodes 910b, 910c, 920b, 920c. Particle beams which may be influenced by the useful electrical field may pass through said openings 950b, 950c and, thus, also through the substrate 940. In the embodiment of the electromechanical component 900b, 900c, there is thus the possibility that a respective first electrode 910b, 910c with a respective second electrode 920b, 920c may be configured such that the respective useful electrical field is suited to influence, or deflect, a particle beam. The openings 950b, 950c may be configured such that a particle beam passes through the opening 950b, 950c at a first operational potential difference. For example, the electromechanical component may be designed such that this case occurs at a potential difference of 0 V.

In order to achieve the complementary effect, the opening 950b, 950c may further be configured such that a particle beam is eliminated at a second operational potential difference. This operational potential difference may be selected to be e.g. 5 V; other potential differences are also feasible. Depending on the type of the particle beam, a higher or lower potential difference may be advantageous as compared to the above-mentioned potential difference of 5 V.

Basically, the first operational potential difference differs from the second operational potential difference. In this manner, the respective two electrodes 910b, 910c, 920b, 920c, between which the opening 950b, 950c (aperture) is located, may form a deflection cell. As was described, the electrodes 910b, 910c, 920b, 920c may thus be used for deflecting, e.g., particle beams of charged particles, but also for eliminating the particle beam.

The electrodes 910b, 910c, 920b, 920c may also be used for influencing charged or uncharged particles or particle beams. It is also possible for a particle beam (photons, ions, charged or uncharged particles) to fly through the aperture 950b, 950c and to be influenced by the electrodes 910b, 910c, 920b, 920c. What is not mentioned here is the electrode 920a and 910d, since their complementary electrodes 910a and 920d are not depicted. The electromechanical component arrangement 901 may generally be manufactured such that the deflection cells 900a and 900d are also present. Of course, further deflection cells 900 which have not been mentioned are also feasible.

The embodiment may also include the possibility of the electromechanical component being manufactured such that the second electrode 920a, 920b, 920c and the proving structure 930b, 930c, 930d are electrically coupled to a reference potential supply of a circuit. For example, this may be implemented such that the second electrode 920a, 920b, 920c and the proving structure 930b, 930c, 930d have the reference potential, which may be defined as 0 V, for example. In this context, it may be useful for the first electrode 910b, 910c, 910d to be configured to comprise a potential different from the potential of the circuit. This may be implemented such that a circuit is configured such that the potential of the first electrode 910b, 910c, 910d may be set to be within a desired range during operation.

Crosstalk of the electrical field to adjacent electrodes is to be prevented, or reduced, in the above-mentioned cases by a crosstalk shield 930b, 930c, 930d. FIG. 9 illustrates the setup of the electrodes with a possible crosstalk shield 930b, 930c, 930d. The crosstalk shield 930b, 930c, 930c may be conductively connected to reference potential and may consist of a conductive material itself. To implement the crosstalk shield 930b, 930c, 930d, titanium, aluminum or alloys thereof (e.g. titanium-aluminum, TiAl, or AlSiTi) may be used. For example, the proving structure 930c may reduce crosstalk of the field, which emanates from the first electrode 910c, to the electromechanical component 900b.

The invention thus includes a plate 930b, 930c, 930d (which may be used as a crosstalk shield at the same time) which is located above the deflection electrode 910b, 910c, 910d and may be designed such that it may be deflected upon application of a voltage at the deflection electrode 910b, 910c, 910d. Deflection here may be effected by the electrostatically attracting force between the controlled deflection electrode 910b, 910c, 910d and the plate 930b, 930c, 930d which is at reference potential (ground potential). Due to the arrangement above the deflection electrode 910b, 910c, 910d, to the firm connection with the surrounding reference potential electrode 920a, 920b, 920c (ground electrode) and to the choice of an elastic material (TiAl, AlSiTi or the like), such a design may readily be implemented. The plate 930b, 930c, 930d may be configured to be able to be heavily deflected by approx. 20 to 40 nm upon application of the deflection voltage of 5 V. This deflection may then be measured, for example, by means of white-light interferometers (WLI) or within a light microscope.

Figure 10:
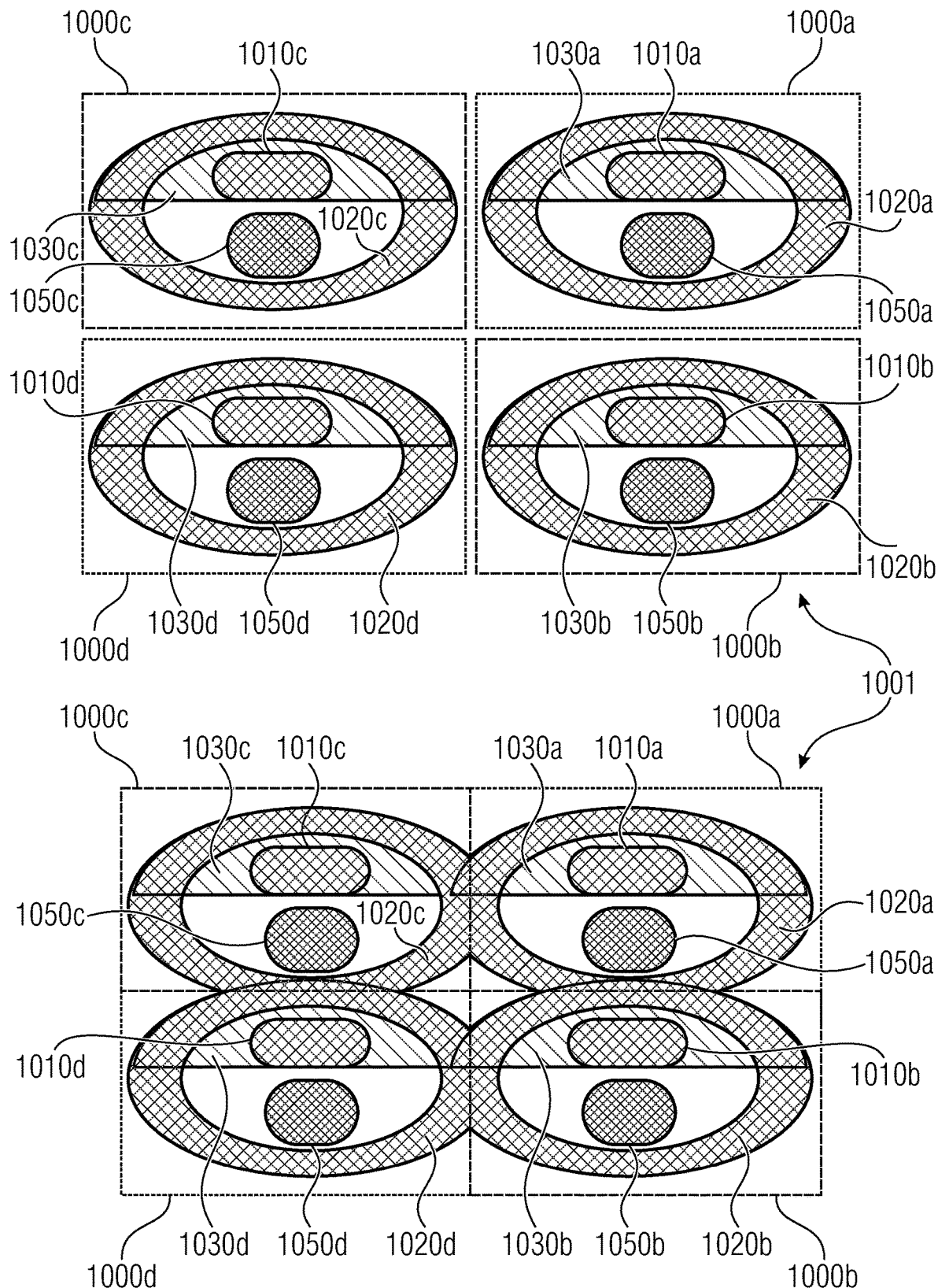
FIG. 10 shows two schematic top views of an electromechanical component arrangement in accordance with a tenth embodiment of the present invention.

Embodiment of FIG. 10

FIG. 10 shows a schematic top view of an electromechanical component arrangement 1001 in accordance with a tenth embodiment of the present invention. In this context, the electromechanical component arrangement 1001 comprises a plurality of electromechanical components 1000a, 1000b, 1000c, 1000d, or parts of electromechanical components. The top view shows an arrangement of 2×2 deflection cells, or electromechanical components 1000a, 1000b, 1000c, 1000d.

The electromechanical component arrangement 1001 may be manufactured such that the electromechanical components 1000a, 1000b, 1000c, 1000d are arranged on a substrate 1040; in the case depicted in FIG. 10, the substrate 1040 may be considered as being an entire surface below the electromechanical components 1000a, 1000b, 1000c, 1000d.

It is possible to arrange the electromechanical components 1000a, 1000b, 1000c, 1000d in both spatial directions of the surface of the substrate 1040 without them having a geometrical order. Rather, the order of the electromechanical components 1000a, 1000b, 1000c, 1000d may orientate itself by an order of, e.g., electron beams, it being possible, in turn, for the order of the electron beams to be predefined by a case of application. However, depending on the application, it may also be useful for the electromechanical component arrangement 1001 to be manufactured such that, as shown in FIG. 10, the electromechanical component arrangement 1001 comprises a row and/or column structure.

Here, a respective row and/or a respective column comprises a plurality of electromechanical components 1000a, 1000b, 1000c, 1000d. Thus, for example, any number of electromechanical components 1000a, 1000b, 1000c, 1000d used as deflection cells may be arranged in any arrangement desired on a surface (such as a chip, a substrate or the like) in both spatial directions. In this case, one may also speak of a deflection matrix.

Said deflection matrix may deflect a multitude of electron beams, for example. Due to the large number of electron beams it is useful, in turn, to have a simple method of proving the functionality of a single electromechanical component 1000a, 1000b, 1000c, 1000d. This is enabled by means of the proving structure 1030 without having to reproduce an elaborate useful effect for performing a functional test.

What will be considered below initially is only the mutual interaction of the two electromechanical components 1000a, 1000b, or parts of the two electromechanical components 1000a, 1000b. All of the parts of the electromechanical components concerned have the same final letter, i.e. a or b, as the electromechanical component. In the embodiment below, the second electrode 1020a of the electromechanical component 1000a serves to attach the proving structure 1030b of the electromechanical component 1000b. In this context, the proving structure 1030b may also shield off a field which emanates from the first electrode 1010b and would crosstalk, e.g., to the electromechanical component 1000a. The second electrode 1020a may have a comparable, also shielding, effect on a field of the first electrode 1010b.

The proving structure 1030*b* and the second electrode 1020*a* may be electrically coupled and may also have a common potential, for example the reference potential of the electromechanical component arrangement 1001.

Due to a potential difference between the first electrode 1010*b* and the second electrode 1020*b* of the electromechanical component 1000*b*, a useful electrical field may be present. Both electrodes 1010*b* and 1020*b* have an opening 1050*b* located between them which may serve, for example, as a passage through the substrate 1040 for a particle beam which may be influenced by the useful field between the first electrode 1010*b* and the second electrode 1020*b*. The second electrode 1020*b* in turn may have a proving structure 1030*c* mounted thereon which is associated with an electromechanical component 1000*c* not depicted and may be used, for example, for proving the existence of a potential difference between the first electrode 1010*c* and a second electrode 1020*c*, which are not depicted in FIG. 10. By analogy, the interaction of the two electromechanical components 1000*c*, 1000*d* may also be described.

Moreover, the second electrode 1020*a* and the second electrode 1020*c* may also shield off the field which emanates from the first electrode 1010*c* of the electromechanical component 1000*c*. The two electrodes 1020*a* and 1020*d* have a similar effect on the field of the first electrode 1010*d*. This briefly describes the shielding effect within one row of the electromechanical component arrangement and of two electromechanical components located diagonally in relation to each other. This may also be continued in a similar manner in an extended matrix.

The embodiment of the electromechanical component arrangement 1001 may be regarded such that the electromechanical component arrangement 1001 comprises at least two electromechanical components 1000*a*, 1000*b*. A first electromechanical component 1000*a* in turn comprises a first electrode 1010*a*, a second electrode 1020*a*, and an elastically deformable proving structure 1030*a*.

The first electrode 1010*a* of the first electromechanical component 1000*a* and the second electrode 1020*a* of the first electromechanical component 1000*a* are arranged to generate a first useful electrical field in the event of there being a potential difference between the first electrode 1010*a* of the first electromechanical component 1000*a* and the second electrode 1020*a* of the first electromechanical component 1000*a*. The proving structure 1030*a* of the first electromechanical component 1000*a* is configured to be deflected in the event of there being the potential difference between the first electrode 1010*a* of the first electromechanical component 1000*a* and the second electrode 1020*a* of the first electromechanical component 1000*a*.

The first electromechanical component 1000*a* is further configured to have a useful effect due to the useful field, said useful effect differing from the deflection of the proving structure 1030*a* of the first electromechanical component 1000*a*.

A second electromechanical component 1000*b* further comprises a first electrode 1010*b* and a second electrode 1020*b* and an elastically deformable proving structure 1030*b*.

The first electrode 1010*b* of the second electromechanical component 1000*b* and the second electrode 1020*b* of the second electromechanical component 1000*b* are arranged to generate a second useful electrical field in the event of there being a potential difference between the first electrode 1010*b* of the second electromechanical component 1000*b* and the second electrode 1020*b* of the second electromechanical component 1000*b*. The proving structure 1030*b* of the second electromechanical component 1000*b* is configured to be deflected in the event of there being the potential difference between the first electrode 1010*b* of the second electromechanical component 1000*b* and the second electrode 1020*b* of the second electromechanical component 1000*b*.

The second electromechanical component 1000*b* is further configured to have a useful effect due to the useful field, said useful effect differing from the deflection of the proving structure 1030*bc* of the second electromechanical component 1000*b*.

Parts of the second electrode 1020*a* of the first electromechanical component 1000*a* are provided adjacently to the first electrode 1010*b* of the second electromechanical component 1000*c*.

In addition, the electromechanical component arrangement 1001 is depicted to be configured such that the second electrode 1020*a* of the first electromechanical component 1000*a* is manufactured such that at least each one of three sides of the first electrode 1010*a* of the first electromechanical component 1000*a* has one side of the second electrode 1020*a* of the first electromechanical component 1000*a* located opposite it.

In addition, the bottom part of FIG. 10 depicts the electromechanical component 1001 such that the proving structure 1030*b* of the second electromechanical component 1000*b* is provided on the second electrode 1020*a* of the first electromechanical component 1000*a*. In the embodiment, the second electrode 1020*a* of the first electromechanical component 1000*a*, the proving structure 1030*b* of the second electromechanical component 1000*b* and the first electrode 1010*b* of the second electromechanical component 1000*b* are arranged such that the first electrode 1010*b* is located between the proving structure 1030*b* of the second electromechanical component 1000*b* and the substrate 1040.

In the following, the reference numerals having no final letters may be considered as being exemplary of a useful implementation of the corresponding electromechanical component or parts thereof. It shall be mentioned once again that a respective proving structure 1030, i.e. the so-called plate, which may be conductively connected to an electrode, e.g. the second electrode 1020, may be located on the side of, above or below the other electrode, e.g. the first electrode 1010. It is also possible for the proving structure 1030 to surround several sides of the other electrode, e.g. of the first electrode 1010.

Also, the proving structure 1030 (plate) may be set up above the one electrode, e.g. the first electrode 1010, not only on the opposite electrode, i.e. for example the second electrode 1020, within the electromechanical component 1000 which may be used as a deflection cell, for example, but said proving structure 1030 (plate) may also be set up on an electrode, e.g. a second electrode 1020, of an adjacent electromechanical component 1000, which may also be used as a deflection cell, for example. The proving structure 1030 (the plate) may be set up not only within the deflection cell 1000 itself or within an adjacent deflection cell 1000, or on its second electrode 1020, but also outside of deflection cells. This may be relevant, for example, in the margin of the deflection matrix.

In summary, it may be stated that FIG. 10 depicts a top view of deflection cells. The crosstalk shield 1030 depicted to be semi-transparent may consist of a TiAl plate (or a similar material such as AlSiTi), which is located above the reference potential electrode (ground electrode) 1020 and covers the deflection electrode 1010. Via an anchorage/area of contact, the crosstalk shield 1030 may be conductively connected to the reference potential electrode (ground electrode) 1020. In the embodiment, the aperture 1050 is not covered by a crosstalk shield 1030, so that an electron beam may fly through it unimpededly, for example. The deflection cells 1000 depicted in a top view may be arranged in any number in both spatial directions (X & Y).

Embodiment of a Deflection Matrix

In accordance with a further inventive embodiment, for example, an electron deflection matrix having 512×512 individually controllable cells, each of which may deflect an electron beam, may be developed. Deflection is effected via two oppositely located electrodes, which, in accordance with the notification of the other embodiments, are a first electrode and a second electrode. The electrodes have an opening (aperture) located therebetween through which an individual electron beam is directed in each case.

Also, a type of operation of the deflection matrix is feasible wherein during the on state, the electron beam is not to be deflected and is to fly through the hole/the aperture unimpededly. Here, a voltage of 0 V (reference potential) is applied to both electrodes. It would also be feasible to apply a potential differing from 0 V to both electrodes.

In the off state, one of the two electrodes (the deflection electrode), which, in accordance with the notification of the preceding embodiment, is the first electrode, has a voltage of 5 V applied to it. The opposite (second) electrode is switched to 0 V (reference potential) at any time. This results in an electrical field between both electrodes, whereby the electron beam is deflected and is eliminated by a diaphragm located within the optical path.

The intention is that it be possible to deflect and eliminate each of the 512×512 electron beams individually when it flies through the respective cell. This would be possible, for example, by extending the embodiment of FIG. 10 in that each of a total of 512 columns has, in turn, 512 row-forming electromechanical components located therein.

Figure 11:
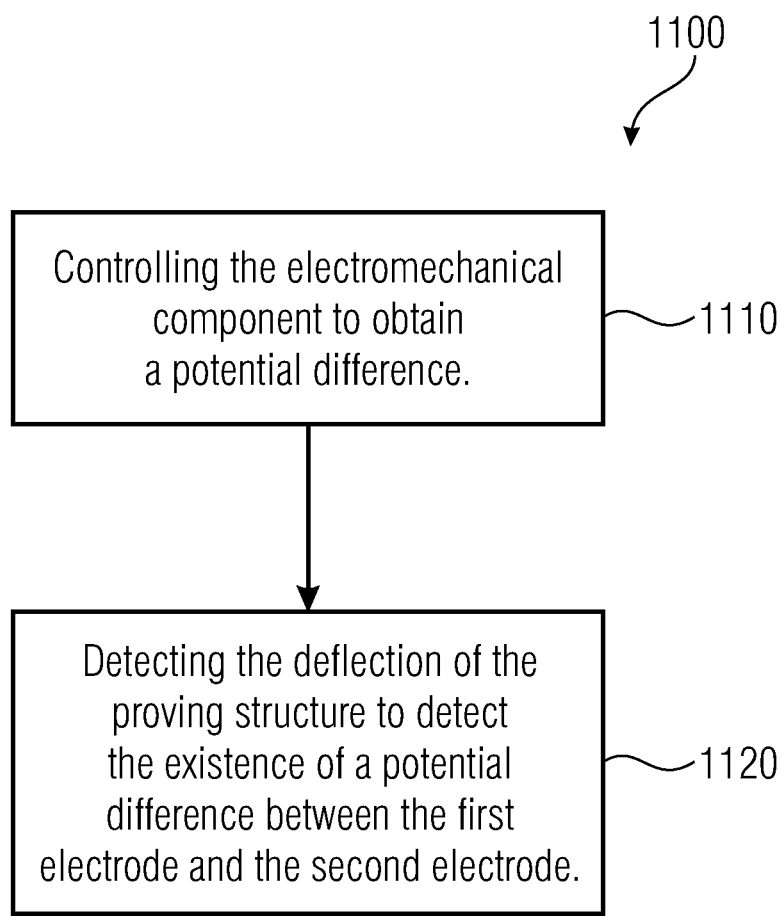
FIG. 11 shows a flow chart of a method in accordance with an embodiment of the present invention.

Embodiment of FIG. 11

A method 1100 of operating an electromechanical component for detecting a potential difference which has the following features will be explained below with reference to FIG. 11: the electromechanical component comprises a first electrode, a second electrode, and an elastically deformable proving structure. The first electrode and the second electrode are arranged to generate a useful electrical field in the event of there being a potential difference between the first electrode and the second electrode.

The proving structure comprises a conductive structure, for example, and is configured to be deflected, for example by an electrostatic force, in the event of there being the potential difference between the first electrode and the second electrode. In addition, the electromechanical component is configured to have a useful effect, caused by the useful field, which differs from the deflection of the proving structure.

The method 1100 itself comprises a first step 1110 which comprises controlling of the electromechanical component so as to obtain a potential difference. Moreover, the method comprises a second step 1120 including detection of a deflection of the proving structure so as to detect the existence of a potential difference between the first electrode and the second electrode. Controlling of the electromechanical component may be effected, e.g., via an integrated circuit controlled by logic signals of, e.g., a subordinate circuit.

Thus, a major part of those elements of an overall system which influence the function may be used by means of the operation described. The second step and, thus, the detection may be effected, for example, under a light microscope or by means of a white-light interferometer. This entire operation may be automated to a high degree.

By means of this operating method 1100, possible operation of the electromechanical component may be performed, in principle. Several further operating methods/functional-test methods will be explained below.

Functional-Test Methods

In this context, methods of testing the function of an electromechanical component would also be feasible. Such methods might also perform a functional test on an electromechanical component arrangement in the event of a useful extension. The functional-test method comprises the following steps:

Initially controlling the electromechanical component such that with a functional component, a potential difference arises between the first and second electrodes which is suited to generate the useful electrical field. Consequently, detection of a deflection of a proving structure. In order to ascertain the functional capability, deciding, as a function of the detection of the deflection, whether the electromechanical component is functional. In this context, both qualitative and quantitative decision-making may be suitable. In the event of a quantitative decision, the intensity of the deflection may allow conclusions to be drawn as to the bending strength of the proving structure, and thus, correct manufacturing of the proving structures, which might possibly also be intended to perform a shielding effect, may be verified.

Of course, by means of qualitative detection of the deflection one may also verify whether or not the useful field becomes apparent and, thus, one may also verify, among other things, correct manufacturing of a possibly existing logic circuit and/or correct manufacturing of the electrical connections.

A decisive property of the method of performing a functional test on an electromechanical component may consist in that the decision is made irrespectively of whether or not the useful effect, which differs from the deflection of the proving structure, exists. This means that, e.g., deflection of an electron beam need not be detected in order to perform the functional test. This may mean a clearly reduced level of expenditure involved in the functional test.

Method of Operation

In the method of operating the electromechanical component, the deflection of the proving structure may be detected optically and/or electrically. With electrical detection, it would feasible for the changing capacitance, which results from the deflectable proving structure, to be detected. This may achieved in that initially, a small-signal capacitance is measured, which is measured, e.g., via a high-frequency change in potential difference. Thereafter, a further small-signal capacitance is measured, however in this case with simultaneous superposition of a DC voltage portion on the high-frequency change in potential difference. This DC voltage portion may deflect a functional proving structure and may, thus, change the geometry of the electromechanical component. As a result, the measurable small-signal capacitance would also change.

What would also be feasible is a method of operating the electromechanical component, wherein the deflection of the proving structure is detected by means of a white-light interferometer or a light microscope. Thus, at least two different possibilities of detecting the deflection of the proving structure are available. Depending on the case of application and on the manufacturing of the electromechanical component, the various possibilities may offer advantages over the respectively other possibilities.

In order to simplify detection, it may be useful for the method of operating the electromechanical component to be configured such that the deflection of the proving structure as a result of the potential difference between the first electrode and the second electrode is at least 3 nm, advantageously 5 nm to 100 nm, most advantageously 20 nm to 40 nm. In other words, the proving structure, the so-called plate, may be designed to be deflectable by approx. 20 to 40 nm by the voltage used during operation. This may markedly simplify and accelerate detection in case a large number of electromechanical components are to be tested.

Also, a method of operating the electromechanical component may be found wherein the deflection of the proving structure at a potential difference between the first electrode and the second electrode of up to 10 V, advantageously up to 5 V, is within a desired range. This restriction of the potential difference, for example to values which are useful during operation as well, may avoid overloading of the electromechanical component, for example during the functional test.

In this context, a method of operating the electromechanical component wherein the potential difference between the first electrode and the second electrode switches between 0 V and 5 V during operation is also useful. In this case, too, care may be taken to ensure, e.g. that there is no overloading of the electromechanical component during operation. In other words, one may state that the first electrode, which is located opposite the second electrode connected to ground, is switched between 0 V and 5 V during operation.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. An electromechanical component for deflecting a particle beam, comprising:
a first electrode;
a second electrode;
an elastically deformable proving structure; and
a substrate;
wherein the first electrode and the second electrode are located opposite one another at a distance;
wherein the substrate comprises an opening in a region between the first electrode and the second electrode;
wherein the first electrode and the second electrode are arranged to generate an electrical field in the event of there being a potential difference between the first electrode and the second electrode; and
wherein the opening is configured to enable passage of the particle beam through the electromechanical component;
wherein the first electrode and the second electrode are configured such that the electrical field is suited to influence the particle beam;
wherein the elastically deformable proving structure is configured to be deflected in the event of there being a potential difference between the first electrode and the second electrode;
wherein the opening is configured such that the particle beam passes through the opening along a first trajectory at a first operational potential difference, and
wherein the electromechanical component is configured such that the particle beam extends along a second trajectory at a second operational potential difference.

2. The electromechanical component as claimed in claim 1, wherein the elastically deformable proving structure comprises a base surface; and
wherein the elastically deformable proving structure comprises a further surface, which is essentially perpendicular to the base surface; and
wherein the elastically deformable proving structure comprises an upper face, which is essentially in parallel with the base surface.

3. The electromechanical component as claimed in claim 1, wherein the elastically deformable proving structure comprises at least one region comprising an elastic material.

4. The electromechanical component as claimed in claim 1, wherein the elastically deformable proving structure comprises at least one region made of titanium or of aluminum or of titanium-aluminum or of aluminum-silicon-titanium.

5. The electromechanical component as claimed in claim 1, wherein the elastically deformable proving structure overlaps the first electrode such that a region of the elastically deformable proving structure, which is spaced apart from a mechanical attachment region of the elastically deformable proving structure, is located opposite a region of the first electrode.

6. The electromechanical component as claimed in claim 1, wherein the elastically deformable proving structure comprises a deflection facilitation structure facilitating the deflection of the elastically deformable proving structure and/or reducing the bending strength of the elastically deformable proving structure.

7. The electromechanical component as claimed in claim 6, wherein the deflection facilitation structure is configured such that the elastically deformable proving structure achieves a shielding effect on the field emanating from the first electrode; and
wherein the deflection facilitation structure is configured to facilitate the deflection of the elastically deformable proving structure as compared to a elastically deformable proving structure which does not comprise the deflection facilitation structure.

8. The electromechanical component as claimed in claim 6, wherein the elastically deformable proving structure comprises at least two slits; and
wherein the elastically deformable proving structure comprises a free end; and
wherein a first slit of extends from the free end of the elastically deformable proving structure to an inner region of the elastically deformable proving structure; and
wherein a second slit extends from the free end of the elastically deformable proving structure to an inner region of the elastically deformable proving structure; and
wherein the first slit and the second slit are provided at a mutual distance.

9. The electromechanical component as claimed in claim 6, wherein the elastically deformable proving structure comprises at least three slits; and wherein the elastically deformable proving structure comprises a free end; and wherein a first slit extends, in a first portion of the first slit, from the free end of the elastically deformable proving structure to an inner region of the elastically deformable proving structure, and, following this, extends, within the inner region of the elastically deformable proving structure, in a second portion of the first slit; and wherein a second slit extends, in a first portion of the second slit, from the free end of the elastically deformable proving structure to the inner region of the elastically deformable proving structure, and, following this, extends, within the inner region of the elastically deformable proving structure, in a second portion of the second slit; and wherein a third slit extends within the inner region of the elastically deformable proving structure, said third slit being adjacent to the second portion of the first slit and to the second portion of the second slit; and wherein the second portion of the first slit extends, within a region adjacent to a first portion of the third slit, essentially in parallel with the first portion of the third slit; and wherein the second portion of the second slit extends, within a region adjacent to a second portion of the third slit, essentially in parallel with the second portion of the third slit; and wherein the first portion of the third slit merges into the second portion of the third slit.

10. The electromechanical component as claimed in claim 1, wherein the elastically deformable proving structure is configured to achieve a shielding effect on a field emanating from the first electrode.

11. The electromechanical component as claimed in claim 1, wherein the first electrode is arranged on a substrate, and wherein the elastically deformable proving structure overlaps the first electrode such that the first electrode is located at least partly between the elastically deformable proving structure and the substrate so as to achieve a shielding effect on the field emanating from the first electrode.

12. The electromechanical component as claimed in claim 1, wherein the elastically deformable proving structure comprises several portions located opposite several lateral surfaces of the first electrode so as to shield the electrode off toward several directions.

13. The electromechanical component as claimed in claim 1, wherein the first electrode and/or the second electrode are raised as compared to a main surface of the substrate.

14. The electromechanical component as claimed in claim 1, wherein the second electrode is higher, in relation to a main surface of the substrate, than the first electrode.

15. The electromechanical component as claimed in claim 1, wherein the first electrode and the second electrode are located opposite each other.

16. The electromechanical component as claimed in claim 1, wherein the first electrode and the second electrode are configured such that the electrical field is suited to influence at least one mechanical structure; and wherein the mechanical structure differs from the elastically deformable proving structure.

17. The electromechanical component as claimed in claim 1, wherein the first electrode and the second electrode are configured such that the electrical field is suited to influence electromagnetic radiation and/or individual photons.

18. The electromechanical component as claimed in claim 1, wherein the first electrode and the second electrode are configured such that the electrical field is suited to deflect or to influence a particle beam of charged particles.

19. The electromechanical component as claimed in claim 1, wherein the second electrode and the elastically deformable proving structure are electrically coupled to a reference potential supply of a circuit; and wherein the first electrode is configured to comprise a potential different from the reference potential of the circuit.

20. An electromechanical component arrangement, said electromechanical component arrangement comprising a plurality of electromechanical components as claimed in claim 1.

21. The electromechanical component arrangement as claimed in claim 20, wherein the electromechanical components are arranged on a substrate; and wherein the electromechanical components are arranged in both spatial directions of the surface of the substrate.

22. The electromechanical component arrangement as claimed in claim 20, said electromechanical component arrangement comprising a row and/or column structure; and wherein a respective row and/or a respective column comprises a plurality of electromechanical components.

23. The electromechanical component arrangement as claimed in claim 20, said electromechanical component arrangement comprising at least two electromechanical components; and wherein a first electromechanical component comprises a first electrode and a second electrode and an elastically deformable elastically deformable proving structure;

wherein the first electrode of the first electromechanical component and the second electrode of the first electromechanical component are arranged to generate a first electrical field in the event of there being a potential difference between the first electrode of the first electromechanical component and the second electrode of the first electromechanical component; and wherein the elastically deformable proving structure of the first electromechanical component is configured to be deflected in the event of there being a potential difference between the first electrode of the first electromechanical component and the second electrode of the first electromechanical component; and wherein a second electromechanical component comprises a first electrode and a second electrode and an elastically deformable elastically deformable proving structure;

wherein the first electrode of the second electromechanical component and the second electrode of the second electromechanical component are arranged to generate a second electrical field in the event of there being a potential difference between the first electrode of the second electromechanical component and the second electrode of the second electromechanical component; and wherein the elastically deformable proving structure of the second electromechanical component is configured to be deflected in the event of there being the potential difference between the first electrode of the second electromechanical component and the second electrode of the second electromechanical component; and wherein the second electrode of the first electromechanical component is provided adjacently to the first electrode of the second electromechanical component.

24. The electromechanical component arrangement as claimed in claim 23, wherein the elastically deformable proving structure of the second electromechanical component is provided on the second electrode of the first electromechanical component.

25. The electromechanical component arrangement as claimed in claim 23, wherein the second electrode of the first electromechanical component is manufactured such that each of three sides of the first electrode of the second electromechanical component comprises one side of the second electrode of the first electromechanical component located opposite it.

26. The electromechanical component arrangement as claimed in claim 23, wherein the elastically deformable proving structure of the second electromechanical component is provided on the second electrode of the first electromechanical component; and
wherein the first electrode of the second electromechanical component is located at least partly between the elastically deformable proving structure of the second electromechanical component and the substrate.

27. A method of performing a functional test on an electromechanical component as claimed in claim 1, the method comprising:
controlling the electromechanical component such that with a functional component, a potential difference arises between the first and the second electrodes which is suited to generate the electrical field; and
detecting a deflection of the elastically deformable proving structure; and
deciding, as a function of the detection of the deflection, whether or not the electromechanical component is functional.

28. The method as claimed in claim 27,
wherein the decision is made irrespectively of the deflection of the particle beam.

29. The method as claimed in claim 27, wherein the deflection of the elastically deformable proving structure is detected optically and/or electrically.

30. The method as claimed in claim 27, wherein the deflection of the elastically deformable proving structure is detected by means of a white-light interferometer or of a light microscope.

31. The method as claimed in claim 27, wherein the deflection of the elastically deformable proving structure that is due to the potential difference between the first electrode and the second electrode is at least 3 nm, advantageously at least 5 nm, most advantageously at least 20 nm.

32. The method as claimed in claim 27, wherein, at a potential difference between the first electrode and the second electrode of up to 50 V, advantageously up to 10 V, the deflection of the elastically deformable proving structure will be within a pre-defined range.

33. The method as claimed in claim 27, wherein the potential difference between the first electrode and the second electrode changes by a maximum of 50 V during operation.

34. The method as claimed in claim 27, wherein the deflection of the elastically deformable proving structure is detected optically and/or electrically.

* * * * *

UNITED STATES PATENT AND TRADEMARK OFFICE
CERTIFICATE OF CORRECTION

| | |
|---|---|
| PATENT NO. | : 11,079,411 B2 |
| APPLICATION NO. | : 16/159552 |
| DATED | : August 3, 2021 |
| INVENTOR(S) | : Linus Elsässer et al. |

It is certified that error appears in the above-identified patent and that said Letters Patent is hereby corrected as shown below:

On the Title Page

Column 1, In Item (12) and Item (72), please delete "Elsäber" and insert therefor --Elsässer--

Signed and Sealed this
Thirty-first Day of May, 2022

*Katherine Kelly Vidal*
*Director of the United States Patent and Trademark Office*